(12) United States Patent
Bailey, III et al.

(10) Patent No.: US 7,078,344 B2
(45) Date of Patent: Jul. 18, 2006

(54) STRESS FREE ETCH PROCESSING IN COMBINATION WITH A DYNAMIC LIQUID MENISCUS

(75) Inventors: Andrew D. Bailey, III, Pleasanton, CA (US); Michael Ravkin, Sunnyvale, CA (US); Mikhail Korolik, San Jose, CA (US); Puneet Yadav, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 155 days.

(21) Appl. No.: 10/769,498

(22) Filed: Jan. 30, 2004

(65) Prior Publication Data

US 2005/0090093 A1  Apr. 28, 2005

Related U.S. Application Data

(63) Continuation-in-part of application No. 10/390,117, filed on Mar. 14, 2003, now Pat. No. 6,939,796, and a continuation-in-part of application No. 10/390,520, filed on Mar. 14, 2003, now Pat. No. 6,821,899.

(51) Int. Cl.
*H01L 21/302* (2006.01)

(52) U.S. Cl. .......................... 438/692; 438/5
(58) Field of Classification Search ............ 438/5, 438/10, 690, 691, 692
See application file for complete search history.

(56) References Cited

U.S. PATENT DOCUMENTS

| | | | |
|---|---|---|---|
| 4,838,289 A | 6/1989 | Kottman et al. |
| 4,985,113 A | 1/1991 | Fujimoto et al. |
| 5,009,738 A | 4/1991 | Gruenwald et al. |
| 5,098,516 A | 3/1992 | Norman et al. |
| 5,200,031 A | 4/1993 | Latchford et al. |
| 5,256,565 A | 10/1993 | Bernhardt et al. |
| 5,271,774 A | 12/1993 | Leenaars et al. |
| 5,302,241 A | 4/1994 | Cathey, Jr. |
| 5,380,397 A | 1/1995 | Fukuyama et al. |
| 5,387,315 A | 2/1995 | Sandhu |
| 5,534,751 A | 7/1996 | Lenz et al. |
| 5,556,714 A | 9/1996 | Fukuyama et al. |
| 5,705,223 A | 1/1998 | Bunkofske |

(Continued)

FOREIGN PATENT DOCUMENTS

EP   1 041 614 A1   10/2000

(Continued)

OTHER PUBLICATIONS

Tegal Corporation, "Enabling a Wireless World", p. 1, http://www.tegal.com/.

(Continued)

*Primary Examiner*—Bradley K. Smith
(74) *Attorney, Agent, or Firm*—Martine Penilla & Gencarella, LLP

(57) ABSTRACT

A system and method for planarizing and controlling non-uniformity on a patterned semiconductor substrate includes receiving a patterned semiconductor substrate. The patterned semiconductor substrate having a conductive interconnect material filling multiple features in the pattern. The conductive interconnect material having an overburden portion. A bulk of the overburden portion is removed and a remaining portion of the overburden portion has a non-uniformity. The non-uniformity is mapped, optimal solution determined and a dynamic liquid meniscus etch process recipe is developed to correct the non-uniformity. A dynamic liquid meniscus etch process, using the dynamic liquid meniscus etch process recipe, is applied to correct the non-uniformity to substantially planarize the remaining portion of the overburden portion.

23 Claims, 14 Drawing Sheets

U.S. PATENT DOCUMENTS

| | | | |
|---|---|---|---|
| 5,744,402 A | 4/1998 | Fukazawa et al. |
| 5,770,100 A | 6/1998 | Fukuyama et al. |
| 5,945,351 A | 8/1999 | Mathuni |
| 5,968,847 A | 10/1999 | Ye et al. |
| 5,997,653 A | 12/1999 | Yamasaka |
| 6,004,188 A | 12/1999 | Roy |
| 6,008,130 A | 12/1999 | Henderson et al. |
| 6,051,496 A | 4/2000 | Jang |
| 6,056,864 A | 5/2000 | Cheung |
| 6,083,822 A | 7/2000 | Lee |
| 6,096,230 A | 8/2000 | Scatz et al. |
| 6,133,144 A | 10/2000 | Tsai et al. |
| 6,140,226 A | 10/2000 | Grill et al. |
| 6,147,005 A | 11/2000 | Tu et al. |
| 6,153,116 A | 11/2000 | Yang et al. |
| 6,153,530 A | 11/2000 | Ye et al. |
| 6,174,813 B1 | 1/2001 | Wang |
| 6,184,128 B1 | 2/2001 | Wang et al. |
| 6,221,775 B1 | 4/2001 | Ference et al. |
| 6,227,140 B1 | 5/2001 | Kennedy et al. |
| 6,234,870 B1 | 5/2001 | Uzoh et al. |
| 6,313,025 B1 | 11/2001 | Chittipeddi et al. |
| 6,323,121 B1 | 11/2001 | Liu et al. |
| 6,331,380 B1 | 12/2001 | Ye et al. |
| 6,350,364 B1 | 2/2002 | Jang |
| 6,350,664 B1 | 2/2002 | Haji et al. |
| 6,352,081 B1 | 3/2002 | Lu et al. |
| 6,365,327 B1 | 4/2002 | Chittipeddi et al. |
| 6,368,517 B1 | 4/2002 | Hwang et al. |
| 6,383,935 B1 | 5/2002 | Lin et al. |
| 6,398,975 B1 | 6/2002 | Mertens et al. |
| 6,408,786 B1 | 6/2002 | Kennedy et al. |
| 6,417,093 B1 | 7/2002 | Xie et al. |
| 6,423,200 B1 | 7/2002 | Hymes |
| 6,440,840 B1 | 8/2002 | Chen |
| 6,448,176 B1 | 9/2002 | Grill et al. |
| 6,475,298 B1 | 11/2002 | O'Donnell et al. |
| 6,479,391 B1 | 11/2002 | Morrow et al. |
| 6,482,331 B1 | 11/2002 | Lu et al. |
| 6,482,755 B1 | 11/2002 | Ngo et al. |
| 6,486,059 B1 | 11/2002 | Lee et al. |
| 6,491,764 B1 | 12/2002 | Mertens et al. |
| 6,500,357 B1 | 12/2002 | Luo et al. |
| 6,517,413 B1 | 2/2003 | Hu et al. |
| 6,527,911 B1 | 3/2003 | Yen et al. |
| 6,559,049 B1 | 5/2003 | Chen et al. |
| 6,573,187 B1 | 6/2003 | Chen et al. |
| 6,576,550 B1 | 6/2003 | Brase et al. |
| 6,579,800 B1 | 6/2003 | Basol et al. |
| 6,582,974 B1 | 6/2003 | Lui et al. |
| 6,600,229 B1 | 7/2003 | Mukherjee et al. |
| 6,617,232 B1 | 9/2003 | Kim et al. |
| 6,620,726 B1 | 9/2003 | Preusse et al. |
| 6,630,413 B1 | 10/2003 | Todd |
| 6,653,224 B1 | 11/2003 | Gotkis et al. |
| 6,767,829 B1 | 7/2004 | Akahori |
| 2001/0003060 A1 | 6/2001 | Yokohama et al. |
| 2001/0015175 A1 | 8/2001 | Masuda et al. |
| 2001/0018271 A1 | 8/2001 | Yanagisawa |
| 2001/0054381 A1 | 12/2001 | Umotoy et al. |
| 2002/0016084 A1 | 2/2002 | Todd |
| 2002/0045354 A1 | 4/2002 | Ye et al. |
| 2002/0081854 A1 | 6/2002 | Morrow et al. |
| 2002/0121500 A1 | 9/2002 | Annapragada et al. |
| 2002/0124867 A1 | 9/2002 | Kim et al. |
| 2002/0153350 A1 | 10/2002 | Lu et al. |
| 2002/0155695 A1 | 10/2002 | Lee et al. |
| 2002/0175071 A1 | 11/2002 | Hymes |
| 2002/0182853 A1 | 12/2002 | Chen et al. |
| 2002/0187627 A1 | 12/2002 | Yuang |
| 2002/0192957 A1 | 12/2002 | Chien et al. |
| 2002/0192966 A1 | 12/2002 | Shanmugasundram et al. |
| 2003/0013316 A1 | 1/2003 | Kim et al. |
| 2003/0029567 A1 | 2/2003 | Dhindsa et al. |
| 2003/0032278 A1 | 2/2003 | Chen et al. |
| 2003/0044725 A1 | 3/2003 | Hsue et al. |
| 2003/0045100 A1 | 3/2003 | Saka et al. |
| 2003/0049375 A1 | 3/2003 | Nguyen et al. |
| 2003/0057179 A1 | 3/2003 | Luo et al. |
| 2003/0073319 A1 | 4/2003 | Basol et al. |
| 2003/0082996 A1 | 5/2003 | Fortin et al. |
| 2003/0087586 A1 | 5/2003 | Kaushal et al. |
| 2003/0092260 A1 | 5/2003 | Lui et al. |
| 2003/0119305 A1 | 6/2003 | Huang et al. |
| 2003/0164354 A1 | 9/2003 | Hsieh et al. |
| 2003/0166345 A1 | 9/2003 | Chang |
| 2003/0184732 A1 | 10/2003 | Katz et al. |
| 2003/0186546 A1 | 10/2003 | Wollstein et al. |
| 2003/0196989 A1 | 10/2003 | Zhou et al. |
| 2003/0199112 A1 | 10/2003 | Shanmugasundram et al. |
| 2003/0203321 A1 | 10/2003 | Ma et al. |
| 2003/0211746 A1 | 11/2003 | Chen et al. |
| 2003/0213558 A1 | 11/2003 | Basol et al. |
| 2003/0224596 A1 | 12/2003 | Marxsen et al. |
| 2004/0242012 A1 | 12/2004 | Ikeda |

FOREIGN PATENT DOCUMENTS

| | | |
|---|---|---|
| EP | 1 081 751 A2 | 3/2001 |
| EP | 1 320 128 A1 | 6/2003 |
| JP | 02280330 | 11/1990 |
| JP | 02309638 | 12/1990 |
| JP | 07230993 | 8/1995 |
| JP | 07235543 | 9/1995 |
| JP | 11 067766 | 3/1999 |
| JP | 11350169 | 12/1999 |
| WO | WO 99/46812 | 9/1999 |
| WO | WO 00/03426 | 1/2000 |
| WO | WO 00/59005 | 10/2000 |
| WO | WO 01/88229 | 11/2001 |
| WO | WO 02/37541 A2 | 5/2002 |
| WO | WO 03/026004 | 3/2003 |
| WO | WO 03/058703 | 7/2003 |

OTHER PUBLICATIONS

Tegal Corporation, "Products Information", p. 1-7, http://www.tegal.com/corp/corpinfo.html.

Tegal Corporation, "Products and Services", p. 1, http://www.tegal.com/prod_srvcs/products_serv.html.

Tegal Corporation, "Products and Services, 6500 Hre Series", pp. 1-3, http://www.tegal.com/prod—srvcs/6500—prod.html.

Tegal Corporation, "Products and Services, 900 Series", pp. 1-4, http://www.tegal.com/prod_srvc/900_prod.html.

Tegal Corporation, "Products and Services, Tegal i90X—The Next Generation in Plasma Etch Technology", pp. 1-4, http://www.tegal.com/prod_srvcs/i90x_data_sheet.html.

Nagraj S. Kulkrani, Robert T. DeHoff, "Application of Volatility Diagrams for Low Temperature Dry Etching and Planarization of Copper", Journal of The Electromechanical Society, 2002, pp. G620-G632.

Kazuhide Ohno, Masaaki Sato, Yoshinobu Arita, "Reactive Ion Etching of Copper Films in $SiCl_4$ and $N_2$ Mixture", Japanese Journal of Applied Physics, Jun. 1989, No. 6, Part 2, pp. 1070-1072.

K. Mosig, T. Jacobs, P. Kofron, M. Daniels, K. Brennan, A. Gonzales, R. Augur, J. Wetzel, R. Havemann, A. Shiota, "Single and Dual Damascene Integration of a Spin-on Porous Ultra low-k Material", *IEEE*, 2001 pp. 292-294.

David T. Price, Ronald J. Gutmann, Shyam P. Murarka, "Damascene copper interconnects with polymer ILDs", 1997 Thin Solid Films, pp. 523-528.

Dr. Victor Ku, Low-k Integration Challenges in the Year 2000, Industry Information—What's Up From SEMI—Industry Report, http://dom.semi.org/web/swemi.nsf/webdocs/9221127CB15550BB88256A4900738B6F.

INTEL, Intel 1.2 GHX All copper Pentium 3 Microprocessor Structural Analysis, Chipworks Reports, http://www.chipworks.com/reports/flyers/Intel_P3_013.htm.

Shim Namwoo, "Introduction To InterMetallic Dielectrics & Cu Integration for beginners in our lab.".

Y. Oshita, N. Howi, "Lower temperature plasma etching of Cu using IR light irradiation", Thin Solid Films, 1995.

Lynn R. Allen, John M. Grant, "Tungsten plug etchback and substrate damage measured by atomic force microscopy", J. Vac. Sci Technol. May/Jun. 1995 pp. 918-922.

William F. Marx, Yunju Ra, Richard Yang, Ching-Hwa Chen, "Plasma and processing effects of electrode spacing for tungsten etchback using a bipolar electrostatic wafer clamp", J. Vac. Sci Technol. Nov./Dec. 1994 pp. 3087-3090.

J. Farkas, K.-M. Chi, M.J. Hampden-Smith, T.T. Kodas, "Low-temperature copper etching via reactions with $Cl_2$ and $Pet_3$ under ultrahigh vacuum conditions", J. Appl. Phys, Feb. 1993, pp. 1455-1460.

Seongju Park, T.N. Rhodin, L.C. Rathbun, "Halide formation and etching of Cu thin films with $Cl_2$ and $Br_2$", J. Vac. Sci Technol., Mar./Apr. 1986, pp. 168-172.

Lynn R. Allen, "Tungsten Plug Etchback In A TCP Etcher", Sharp Microelectronics Technology, Inc., pp. 255-263.

N. Hosoi, Y. Ohshita, "Plasma Etching Of Copper Films Using IR Light Irradiation", Mat. Res. Soc. Symp. Proc. vol. 337, 1994, pp. 201-205.

US 7,078,344 B2

STRESS FREE ETCH PROCESSING IN COMBINATION WITH A DYNAMIC LIQUID MENISCUS

CROSS REFERENCE TO RELATED APPLICATIONS

This application is a continuation-in-part of U.S. patent application Ser. No. 10/390,117, now U.S. Pat. No. 6,939,796 filed on Mar. 14, 2003 and entitled "System, Method and Apparatus For Improved Global Dual-Damascene Planarization," which is incorporated herein by reference in its entirety. This application is also a continuation-in-part of U.S. patent application Ser. No. 10/390,520, now U.S. Pat. No. 6,821,899 filed on Mar. 14, 2003 and entitled "System, Method and Apparatus For Improved Local Dual-Damascene Planarization," which is incorporated herein by reference in its entirety.

BACKGROUND OF THE INVENTION

1. Field of the Invention

The present invention relates generally to dual damascene semiconductor manufacturing processes, and more particularly, to methods and systems for planarizing features and layers and controlling uniformity in a semiconductor manufacturing process.

2. Description of the Related Art

Dual damascene manufacturing processes are becoming more common in semiconductor manufacturing. In a typical dual damascene manufacturing process, one or more conductive materials are deposited in previously patterned trenches and vias formed in a semiconductor substrate or films formed on the semiconductor substrate to form the desired electrical circuit interconnects. An excess or overburden portion of the conductive material is often formed. The overburden portion of the conductive material is unnecessary and undesirable and must be removed both to produce a damascene feature and to provide a uniform and planar surface for subsequent processing.

The overburden portion of the conductive material is typically removed from the semiconductor substrate through chemical mechanical polishing (CMP) and electrochemical polishing (ECP) (e.g., etching) processes and combinations of CMP and ECP processes. Each of these processes has significant shortfalls. By way of example, ECP typically has a relatively low throughput, poor uniformity and inability to effectively remove non-conductive material.

CMP requires physical contact processes which typically leave conductive residues, or cause corrosion of the various materials, or result in non-uniform removal, and the inability to suitably planarize interconnect and interlevel dielectric (ILD) top surface. CMP can also cause stress related damage (e.g., interlayer delamination, peeling) to remaining interconnect and ILD structures. The CMP-caused stress damage is further exacerbated by the very poor inter-layer adhesion characteristics of the more-recently used materials. Reducing the physical force of the CMP process to reduce the physical stress can often result in unacceptably low throughput rates and other poor process performance parameters.

In view of the foregoing, there is a need for an improved planarizing system and method to uniformly and substantially remove overburden material while minimizing physical stress to the remaining features. The improved planarizing system and method should be suitable for use in semiconductor manufacturing and should be applicable to processes such as a dual damascene process or other semiconductor manufacturing processes.

SUMMARY OF THE INVENTION

Broadly speaking, the present invention fills these needs by providing a system and method for planarizing and etching a semiconductor substrate. It should be appreciated that the present invention can be implemented in numerous ways, including as a process, an apparatus, a system, computer readable media, or a device. Several inventive embodiments of the present invention are described below.

One embodiment includes a method for planarizing a patterned semiconductor substrate includes receiving a patterned semiconductor substrate. The patterned semiconductor substrate having a conductive interconnect material filling multiple features in the pattern. The conductive interconnect material having an overburden portion. A bulk of the overburden portion is removed and a remaining portion of the overburden portion has a non-uniformity. The non-uniformity is mapped and a dynamic liquid meniscus etch process recipe is developed to correct the non-uniformity. A dynamic liquid meniscus etch process, using the dynamic liquid meniscus etch process recipe, is applied to correct the non-uniformity to substantially planarize the remaining portion of the overburden portion. The conductive interconnect material can include copper and/or elemental copper. The pattern can be formed on the patterned semiconductor substrate in a dual damascene process. Mapping the non-uniformity can include determining a non-uniformity profile for the substrate. The non-uniformity profile for the substrate can include determining a non-uniformity profile model of the preceding process (e.g., the bulk removal process). Developing a dynamic liquid meniscus etch process recipe to correct the non-uniformity can include determining a removal rate profile model for a subsequent process, comparing the non-uniformity profile for the substrate to the removal rate profile model for the subsequent process, and optimizing one or more parameters of the subsequent process. The subsequent process can include at least one of a group of processes consisting of the dynamic liquid meniscus etch process, a dry etch process, and a wet etch process. The bulk removal process used to remove the bulk of the overburden portion can also be optimized to substantially eliminate a continued production of a non-uniformity described by the non-uniformity profile model during the bulk removal process for a subsequently received patterned semiconductor substrate. This embodiment can thereby provide data feed-back to the preceding operations to dynamically tune and optimize the respective operations of the preceding processes. This embodiment can also provide data feed-forward to dynamically tune and optimize subsequent operations of subsequent processes.

Removing the bulk of the overburden portion can include removing the bulk of the overburden portion in a CMP operation. The CMP operation can be a low down-force CMP operation. Removing the bulk of the overburden portion can also include various methods to minimize the amount of lateral stress imparted to the substrate.

An additional layer can also be formed on the overburden portion. The additional layer can be substantially planar. Removing the bulk of the overburden portion can also include substantially entirely removing the additional layer. The additional layer and the overburden portion can have a substantially 1:1 etch selectivity.

Applying the dynamic liquid meniscus etch process using the dynamic liquid meniscus etch process recipe can include monitoring the dynamic liquid meniscus etch process and providing feedback to a dynamic liquid meniscus etch process controller. The dynamic liquid meniscus etch process controller can automatically modify at least one aspect of the dynamic liquid meniscus etch process recipe according to the feedback. The dynamic liquid meniscus etch process controller can move the dynamic liquid meniscus relative to a surface of the substrate.

Monitoring the dynamic liquid meniscus etch process can also include scanning a surface of the substrate with a metrology sensor. The metrology sensor can be included within the dynamic liquid meniscus. The metrology sensor can also map the non-uniformity.

Another embodiment provides a method for forming a semiconductor device. The method includes receiving a patterned semiconductor substrate. The semiconductor substrate having a conductive interconnect material filling multiple features in the pattern. The conductive interconnect material having an overburden portion. A bulk of the overburden portion is removed leaving a remaining portion of the overburden portion that has a non-uniformity. The non-uniformity is mapped. A dynamic liquid meniscus etch process recipe is developed to correct the non-uniformity. A dynamic liquid meniscus etch process using the dynamic liquid meniscus etch process recipe is applied to correct the non-uniformity to substantially planarize the remaining portion of the overburden portion.

Yet another embodiment provides a method of forming a dual damascene interconnect structure. The method includes receiving a dual damascene patterned semiconductor substrate. The semiconductor substrate, having a conductive interconnect material filling one or more features in the dual damascene pattern. The conductive interconnect material having an overburden portion having a non-uniformity. An additional layer is formed on the overburden portion, the additional layer being formed substantially planar. The additional layer and at least part of the overburden portion are etched to remove a bulk of the overburden portion, the additional layer being substantially entirely removed. A remaining portion of the overburden portion has a non-uniformity. The non-uniformity is mapped. A dynamic liquid meniscus etch process recipe is developed to correct the non-uniformity. A dynamic liquid meniscus etch process using the dynamic liquid meniscus etch process recipe is applied to correct the non-uniformity to substantially planarize the remaining portion of the overburden portion.

Applying the dynamic liquid meniscus etch process using the dynamic liquid meniscus etch process recipe can include monitoring the dynamic liquid meniscus etch process and providing feedback to a dynamic liquid meniscus etch process controller. Monitoring the dynamic liquid meniscus etch process can include scanning a surface of the substrate with a metrology sensor. The metrology sensor can be included within the dynamic liquid meniscus.

The present invention provides the advantage of minimizing mechanical stress while substantially eliminating localized non-uniformities. The present invention also enables a wider CMP latitude since the CMP planarity requirements are significantly relaxed as a following proximity etch process can accurately compensate for any CMP non-planarities (e.g., edge effect, local or global non-planarities, etc).

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Figure 1:
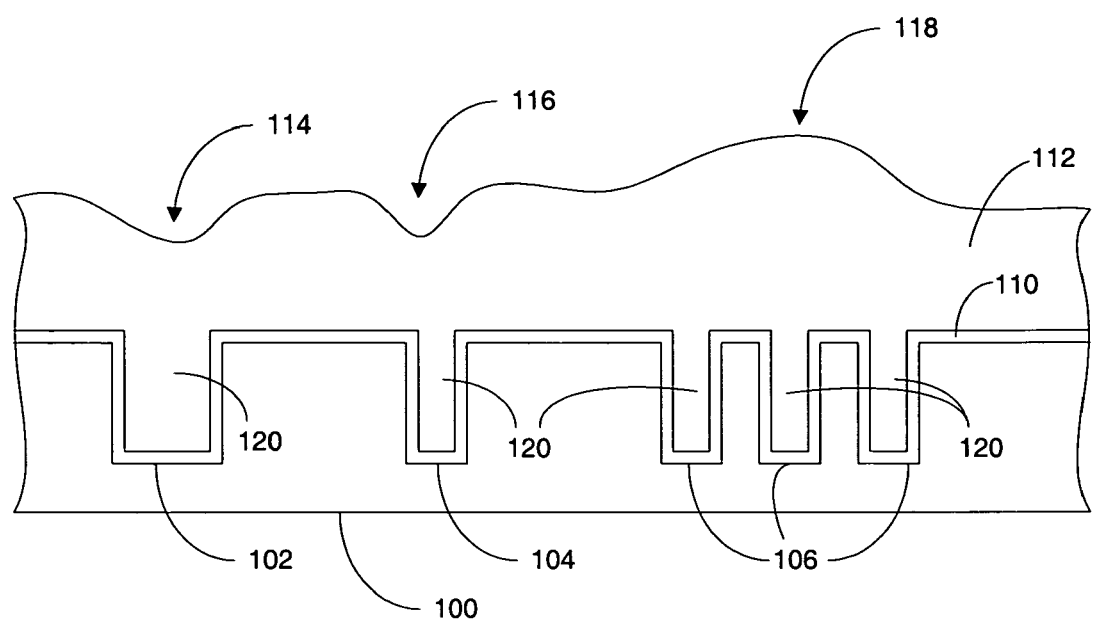
FIG. 1 shows a patterned semiconductor substrate in accordance with one embodiment of the present invention.

Several exemplary embodiments for an improved uniformity control and planarizing system and method will now be described. It will be apparent to those skilled in the art that the present invention may be practiced without some or all of the specific details set forth herein.

One embodiment of an improved uniformity control and planarizing system and method provides improved local planarization and uniformity across a local portion of a semiconductor substrate. The improved local planarization and uniformity substantially eliminates local nonuniformities caused by features in underlying layers and variations in deposition and etch processes. Another embodiment provides improved global planarization and uniformity across the entire substrate (e.g., edge uniformity as compared to center uniformity).

One embodiment includes a method for planarizing a patterned semiconductor substrate includes receiving a patterned semiconductor substrate. The patterned semiconductor substrate having a conductive interconnect material filling multiple of features in the pattern. The conductive interconnect material having an overburden portion. The overburden portion includes a localized non-uniformity. An additional layer is formed on the overburden portion. The additional layer and the overburden portion are planarized. The planarizing process substantially entirely removes the additional layer. The conductive interconnect material can include copper, copper containing conductive materials and elemental copper and other conductive material. The pattern can be formed on the patterned semiconductor substrate in a dual damascene process.

Planarizing the additional layer and the overburden portion can include substantially eliminating a local, pattern dependant non-uniformity. Planarizing the additional layer and the overburden portion can also include substantially eliminating a local, pattern dependant non-uniformity without imparting mechanical stress to the plurality of features.

The additional layer and the overburden portion can have a substantially 1:1 etch selectivity. The additional layer is formed substantially planar and uniform. The additional layer is a substantially planar fill material. Planarizing the additional layer and the overburden portion can also include etching the additional layer and at least part of the overburden portion. A second etch process to expose a barrier layer formed on the patterned features can also be included.

Forming the additional layer on the overburden portion can include chemically converting a top surface and a top portion of the overburden portion. Chemically converting a top surface and a top portion of the overburden portion can include exposing the top surface of the overburden portion to a reactant gas such as a halogen. The additional layer is a halide reactant product of the overburden portion.

Planarizing the additional layer and the overburden portion can include etching the additional layer and at least part of the overburden portion. Planarizing the additional layer and the overburden portion can also include a reiterative process that includes etching the additional layer, forming a second additional layer, and etching the second additional layer. The reiterative process can be an in situ reiterative process.

In another embodiment, a semiconductor device is formed by a method including receiving a patterned semiconductor substrate. The patterned semiconductor substrate having a conductive interconnect material filling multiple features in the pattern. The conductive interconnect material having an overburden portion that includes a localized non-uniformity. An additional layer is formed on the overburden portion and the additional layer and the overburden portion are planarized. The additional layer being substantially entirely removed in the planarizing process.

Yet another embodiment includes a method of forming a dual damascene interconnect structure that includes receiving a dual damascene patterned semiconductor substrate. The dual damascene patterned semiconductor substrate having a conductive interconnect material filling multiple features in the dual damascene pattern. The conductive interconnect material having an overburden portion that includes a localized non-uniformity. An additional layer is formed on the overburden portion. The additional layer being formed substantially planar. The additional layer and at least part of the overburden portion are etched to substantially planarize the overburden portion, the additional layer being substantially entirely removed.

Still another embodiment includes a method of forming a dual damascene interconnect structure that includes receiving a dual damascene patterned semiconductor substrate. The dual damascene patterned semiconductor substrate having a conductive interconnect material filling multiple features in the dual damascene pattern. The conductive interconnect material having an overburden portion that includes a localized non-uniformity. A top surface and a top portion of the overburden portion are chemically converted to form an additional layer on the overburden portion. The additional layer and the overburden portion are planarized, the additional layer being substantially entirely removed in the planarizing process. The planarizing process including a reiterative process that includes etching the additional layer, forming a second additional layer, and etching the second additional layer. The reiterative process can be continued until the remaining overburden portion is substantially planarized.

One embodiment provides a method for planarizing and uniformity control of a patterned semiconductor substrate. The method includes receiving a patterned semiconductor substrate. The patterned semiconductor substrate having a conductive interconnect material filling multiple of features in the pattern. The conductive interconnect material having an overburden portion. The overburden portion having a localized non-uniformity. A bulk portion of the overburden portion is removed to planarize the overburden portion. The substantially locally planarized overburden portion is mapped to determine a global non-uniformity. The substantially locally planarized overburden portion is etched to substantially remove the global non-uniformity. The pattern can be formed on the patterned semiconductor substrate in a dual damascene process.

Removing the bulk portion of the overburden portion can include forming an additional layer on the overburden portion and planarizing the additional layer and the overburden portion. The additional layer being substantially entirely removed in the planarizing process.

Alternatively, removing the bulk portion of the overburden portion can include forming an additional layer on the overburden portion by chemically converting a top surface and a top portion of the overburden portion and etching the additional layer and at least part of the overburden portion to substantially planarize the overburden portion, the additional layer being substantially entirely removed. Planarizing the additional layer and the overburden portion can include a reiterative process that includes etching the additional layer, forming a second additional layer, and etching the second additional layer.

Mapping the substantially locally planarized overburden portion to determine a global non-uniformity can include mapping the substantially locally planarized overburden portion with an eddy current sensor. Mapping the substantially locally planarized overburden portion to determine a global non-uniformity can include mapping the substantially locally planarized overburden portion in-situ.

Etching the substantially locally planarized overburden portion to substantially remove the global non-uniformity can include adjusting an etch recipe to compensate for the global non-uniformity. Alternatively, etching the substantially locally planarized overburden portion to substantially remove the global non-uniformity can include substantially eliminating the global non-uniformity without imparting mechanical stress to the multiple features.

In another alternative, etching the substantially locally planarized overburden portion to substantially remove the global non-uniformity can also include etching to expose a barrier layer formed on the patterned features. The etch can be selective to the barrier. Etching the substantially locally planarized overburden portion to substantially remove the global non-uniformity can include substantially minimizing any recesses of the conductive interconnect material in the multiple features.

A final etch process can also be included. The final etch process can substantially remove the barrier layer formed on the patterned features. The final etch process can also include removal of a mask material. The conductive interconnect material can include copper and/or elemental copper.

Another embodiment includes a semiconductor device formed by a method including receiving a patterned semiconductor substrate. The patterned semiconductor substrate having a conductive interconnect material filling multiple features in the pattern. The conductive interconnect material having an overburden portion that includes a localized non-uniformity. A bulk portion of the overburden portion is removed to planarize the overburden portion. The substantially locally planarized overburden portion is mapped to determine a global non-uniformity. The substantially locally planarized overburden portion is etched to substantially remove the global non-uniformity.

Another embodiment includes a method of forming a dual damascene interconnect structure. The method including receiving a dual damascene patterned semiconductor substrate. The dual damascene patterned semiconductor substrate having a conductive interconnect material filling multiple features in the dual damascene pattern. The conductive interconnect material having an overburden portion that includes a localized non-uniformity. A bulk portion of the overburden portion is removed to planarize the overburden portion. Removing the bulk portion of the overburden portion includes forming an additional layer on the overburden portion and planarizing the additional layer and the overburden portion. The additional layer being substantially entirely removed in the planarizing process. The substantially locally planarized overburden portion is mapped to determine a global non-uniformity. The substantially locally planarized overburden portion is etched to substantially remove the global non-uniformity.

Another embodiment includes a method of forming a dual damascene interconnect structure. The method includes receiving a dual damascene patterned semiconductor substrate. The dual damascene patterned semiconductor substrate having a conductive interconnect material filling multiple features in the dual damascene pattern. The conductive interconnect material includes an overburden portion that includes a localized non-uniformity. A bulk portion of the overburden portion is removed to planarize the overburden portion. Removing the bulk portion of the overburden portion includes forming an additional layer on the overburden portion by chemically converting a top surface and a top portion of the overburden portion. The additional layer and at least part of the overburden portion are etched to substantially planarize the overburden portion. The additional layer being substantially entirely removed. The substantially locally planarized overburden portion is mapped to determine a global non-uniformity. The substantially locally planarized overburden portion is etched to substantially remove the global non-uniformity.

FIG. 1 shows a patterned semiconductor substrate 100 in a dual damascene process in accordance with one embodiment of the present invention. The substrate 100 has been patterned as part of the semiconductor manufacturing process such as a dual damascene manufacturing process. A mask can be used to pattern the substrate 100. The substrate 100 includes a large, somewhat isolated feature 102 (e.g., trench, via, etc.) a smaller, somewhat isolated feature 104 and several features 106 that are densely packed together. A barrier layer 110 is also included. The barrier layer 110 is typically a different material than the substrate 100 or a conductive interconnect material 120. The conductive interconnect material 120 can be copper or copper alloy or other conductive material.

An overburden portion 112 of the conductive interconnect material 120 extends above the features 102, 104, 106 and includes corresponding localized variations 114, 116, 118 in thickness of the overburden portion 112. As shown, the larger feature 102 has a corresponding larger decrease in the thickness of the overburden portion 112 as compared to the smaller feature 104, which has a slightly smaller variation in thickness of the overburden portion 112. The densely packed features 106 have a somewhat increased thickness of the overburden portion 112.

Typical etch processes etch the overburden portion 112 of the conductive interconnect material 120 at a fairly uniform rate over the entire wafer area and therefore the typical etching process will expose a first portion of the barrier layer 110 near the large feature 102 before a second portion of the barrier layer 110 near the densely packed features 106 will be exposed. In sum, the typical etching process cannot planarize and compensate for non-uniformity for the overburden portion 112 of the conductive interconnect material.

Figure 2:
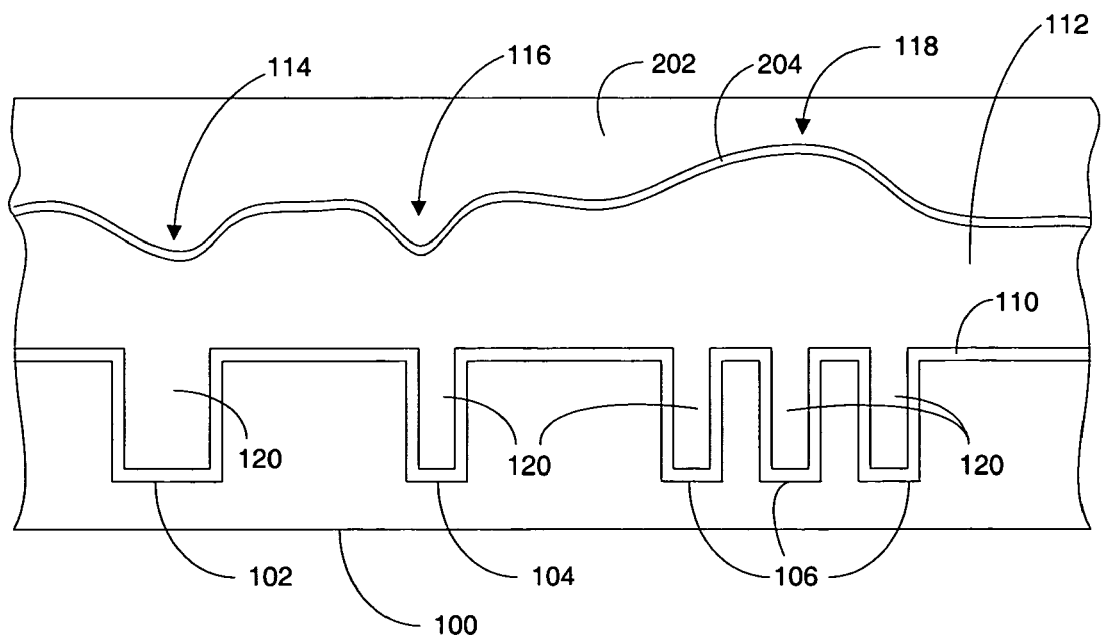
FIG. 2 shows an additional layer added in accordance with one embodiment of the present invention.

FIG. 2 shows an additional layer 202 added in accordance with one embodiment of the present invention. The additional layer 202 is formed on top of the overburden portion 112. The additional layer 202 can be a substantially planar fill material (e.g., spin on glass (SOG), polysilicon, polymer resist, bilayer, UV or thermally curable material, or other material that can flow to form a planar surface and which has the appropriate etching characteristics). An optional, relatively thin (e.g., about 25–100 nm in thickness) conformal layer 204 may also be included between the additional layer 202 and the overburden portion 112. The conformal layer 204 can be a barrier layer or an adhesion layer. The conformal layer 204 can allow a wider variety of materials that can be used for the additional layer 202.

The additional layer 202 and the overburden portion 112 have a substantially 1:1 etch selectivity so that a subsequent etching process (e.g., plasma or gaseous etch process) can etch both the additional layer 202 and the overburden portion 112 at substantially the same rate.

Figure 3:
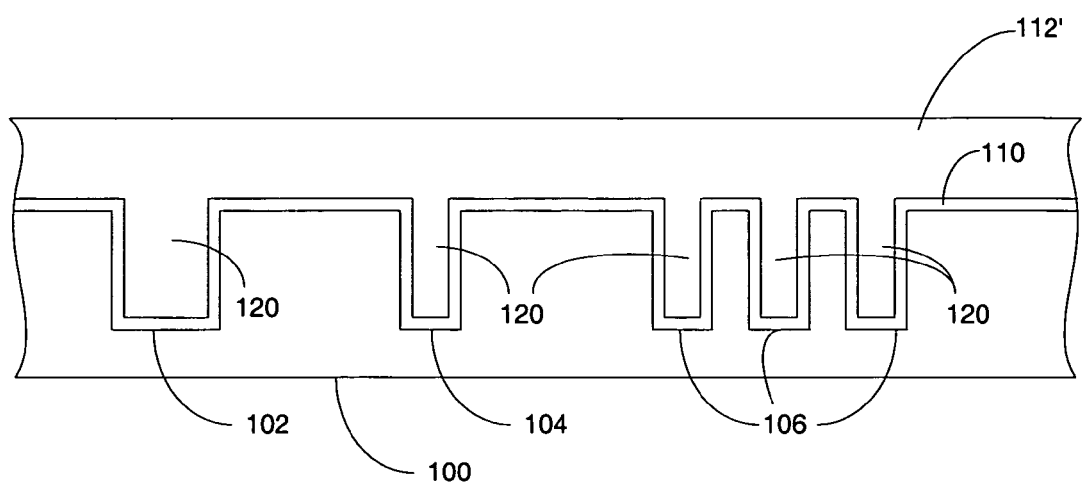
FIG. 3 shows a substantially planar overburden portion in accordance with one embodiment of the present invention.

FIG. 3 shows a substantially planar overburden portion 112' in accordance with one embodiment of the present invention. Because the additional layer 202 forms a substantially planar surface over the stack of layers 100, 110, 112, 202, a first etching process can uniformly etch the additional layer 202 and the overburden portion 112 over the entire area until the remaining overburden portion 112' is substantially locally planar in that the local variations 114, 116, 118 are substantially eliminated.

A typical recipe would involve conditions that provide a 1:1 etch selectivity between the additional layer 202 and the overburden portion 112. By way of example, if the additional layer 202 is SOG, and the overburden portion 112 is copper, then a halogen (e.g., Cl, F, Br, I) based chemistry provides etch rate control for both the SOG as well as copper to allow for tuning for the desired 1:1 selectivity. Although any plasma feed gas producing reactive halogen radicals can be used, CF4, Cl2, and HCl, HBr are typical examples. Various process parameters can be adjusted to control etch rates, selectivity, uniformity and reduce corrosion include variation of process variables such as substrate temperature and inclusion of one or more additives (e.g., Ar, H2, Cl, O2, CH3X (X=F, Cl, Br, I), CH2F2, and CH4).

Another approach involves a sputter dominant etch with Ar or other inert gas such as He, Xe, Ne, Kr, as the primary etchant of the copper overburden portion 112 with other additives to provide etch rate control of the additional layer 202 and passivation of the top surface of the remaining copper 112. The other additives can include, for example H2 and/or CF4. Either of these processes is can operate over a wide temperature range of between about 75 degrees C. and about 400 degrees C.

The first etching process is an etch process designed to leave the remaining overburden portion 112' substantially locally planar in that the local variations 114, 116, 118 are substantially eliminated. One or more subsequent etching processes will remove the bulk or the majority of the overburden portion 112'. A finish etching process can be applied to continue the etching process to an endpoint at which the overburden portion 112' is removed from the barrier 110. The finish etching process can also be included in the bulk etch process. Subsequent processes after the finish etch can include selective barrier removal and passivating the remaining conductive material 120 to prevent corrosion and provide stability for further processing. An additional operation after the finish etch can be designed not to significantly remove any material but only passivate the remaining conductive material 120 to prevent corrosion and provide stability for further processing.

Figure 4A:
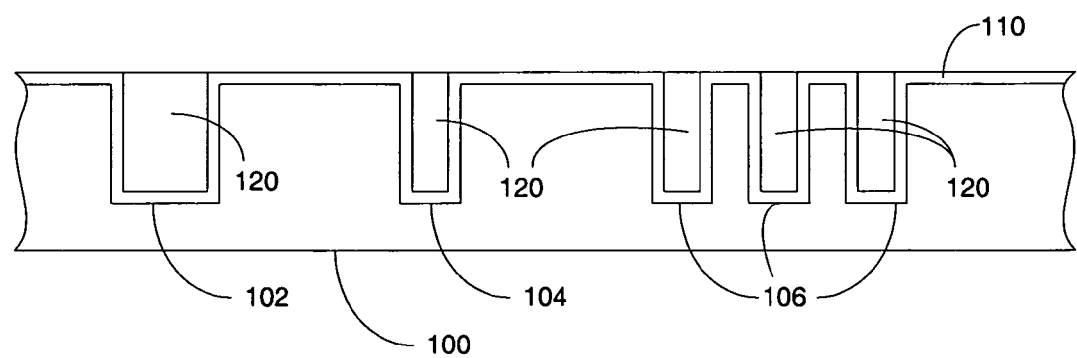
FIG. 4A shows the substrate having undergone a second etching process in accordance with one embodiment of the present invention.

FIG. 4A shows the substrate 100 having undergone a second etching process in accordance with one embodiment of the present invention. The second etching process continues to an endpoint such that the barrier layer 110 will be exposed at all locations substantially simultaneously and leaving only the portion 120 of the conductive material (e.g., copper, copper-containing alloys and combinations, and other conductive material) that fills the features 102, 104, 106.

The first etching process and the second etching process can be substantially similar or significantly different. By way of example, the first etching process can be an etching process for improving the local planarity of the overburden portion 112 due to local non-uniformities 114, 116, 118 (e.g., caused by feature 102, 104, 106 locations, sizes and concentrations in underlying layers). The entire additional layer 202 and a portion of the overburden portion 112 can be removed in the first etching process. By comparison, the second etching process can be a much more selective etching process that removes the bulk of the remaining, planar overburden 112' to the endpoint (i.e., when the barrier layer 110 is exposed).

Figure 4B:
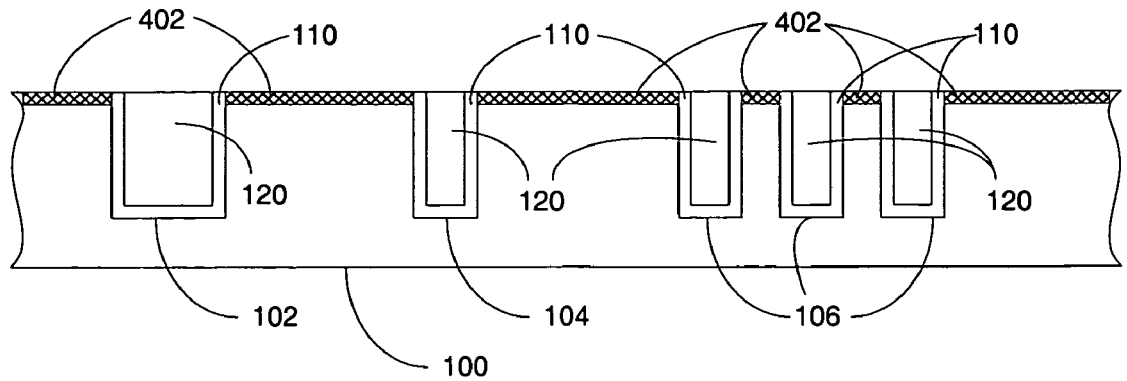
FIG. 4B shows the substrate having undergone a barrier removal process in accordance with one embodiment of the present invention.

FIG. 4B shows the substrate having undergone a barrier removal process in accordance with one embodiment of the present invention. A portion of the barrier layer 110 is removed to expose an underlying mask layer 402. Only the portion of the barrier layer 110 that is formed within the features 102, 104, 106 remain. A typical second etching process removes the bulk portion of the overburden 112 at high rate and preferably with a high selectivity to the barrier layer 110. By way of example, if the overburden portion 112 is copper, a halogen—based chemistry (e.g., Cl2, CF4, HCl, HBr, BCl3) can be effectively used for the second etching process. In another approach a physically dominant etch process such as an Ar (or other noble or inert gas) based sputter process can be used. Various process parameters can be adjusted to control etch rates and selectivity. The various process parameters can include adjusting process variables such as substrate temperature balance of reactive species, and inclusion of one or more additives (e.g., H2, O2, Ar, He, Xe, Ne, Kr, etc.).

Figure 5:
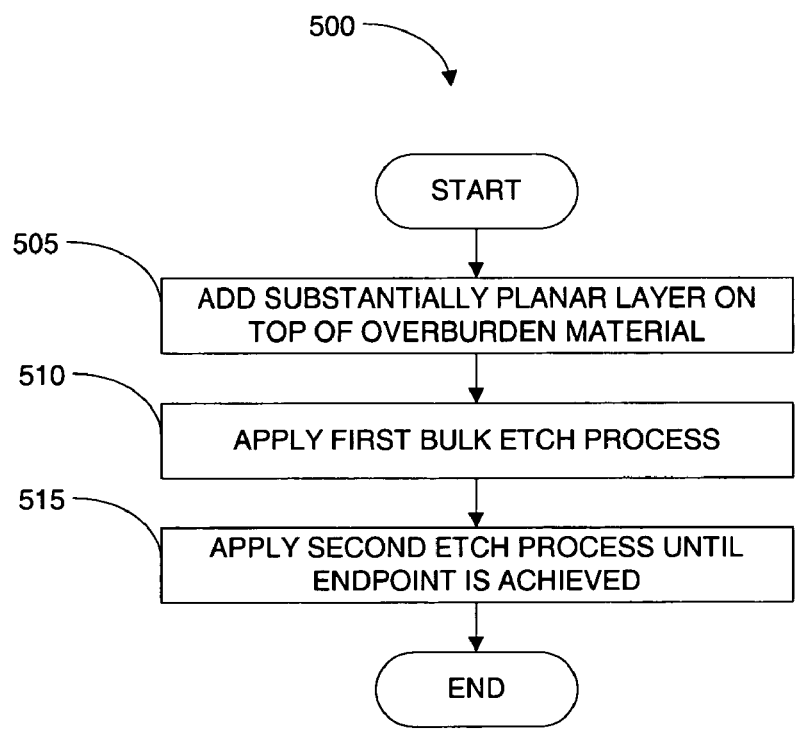
FIG. 5 is a flowchart of the method operations of performing a local planarization, in accordance with one embodiment of the present invention.

FIG. 5 is a flowchart 500 of the method operations of performing a local planarization, in accordance with one embodiment of the present invention. In operation 505, the additional layer 202 is added on top of the conductive overburden portion 112. In operation 510, the first etch process is applied to remove the majority of the additional layer 202 and the conductive overburden portion 112. In operation 515, the second etch process is applied to remove the remaining overburden portion 112' to the endpoint.

In an alternative embodiment, operation 515 can also include a finish etch process as described above. Subsequent processes after the finish etch can include selective barrier removal and passivating the remaining conductive material 120 to prevent corrosion and provide stability for further processing. An additional operation after the finish etch process can be designed not to significantly remove any material but only passivate the remaining conductive material 120 to prevent corrosion and provide stability for further processing.

Figure 6A:
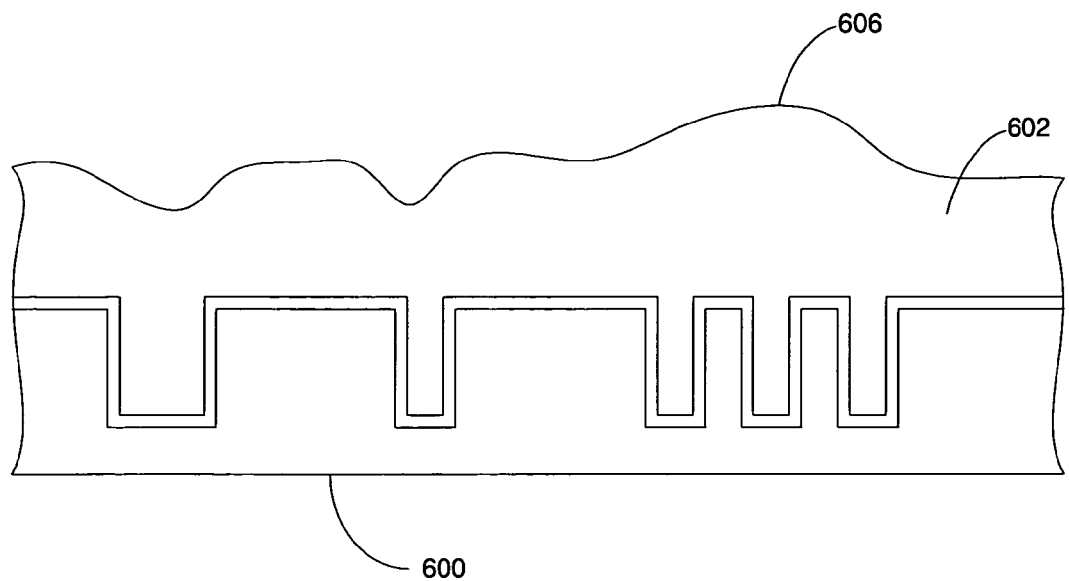
FIGS. 6A–6D show a sequence of chemical conversion and etch-back processes applied to a substrate to increase local uniformity, in accordance with one embodiment of the present invention.

FIGS. 6A–6D show a sequence of chemical conversion and etch-back processes applied to a substrate 600 to increase local uniformity, in accordance with one embodiment of the present invention. FIG. 7 is a flowchart 700 of the method operations of the chemical conversion and etch-back processes applied to a substrate 600 to increase local uniformity, in accordance with one embodiment of the present invention. As shown in FIG. 6A, the substrate 600 has a substantially non-planar overburden portion 602 with non-planar surface profile 606, similar to the substrate 100 described in FIG. 1 above.

Figure 6B:
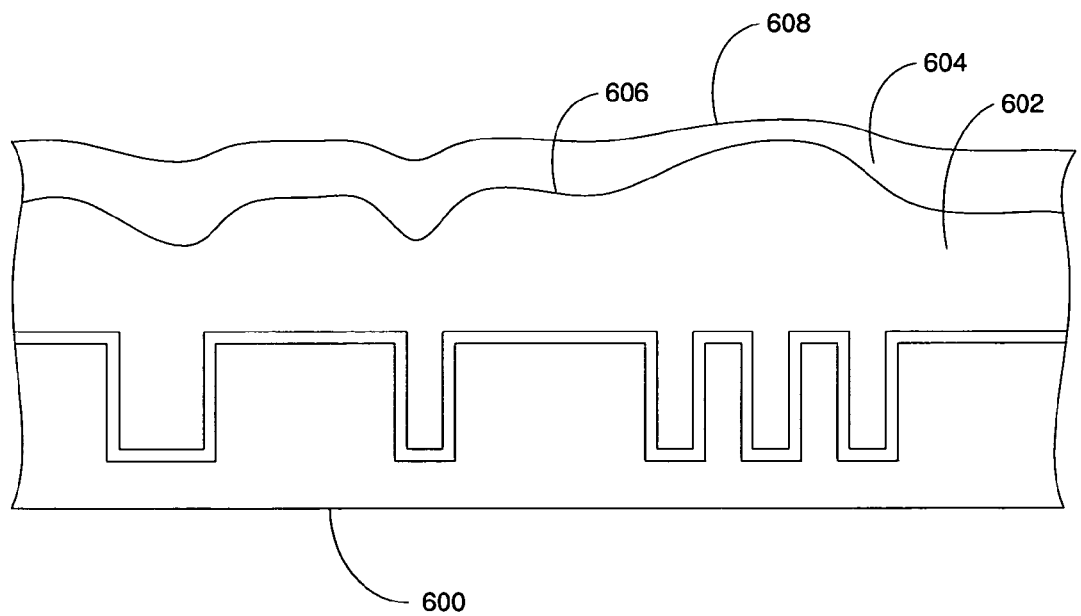
Figure 7:
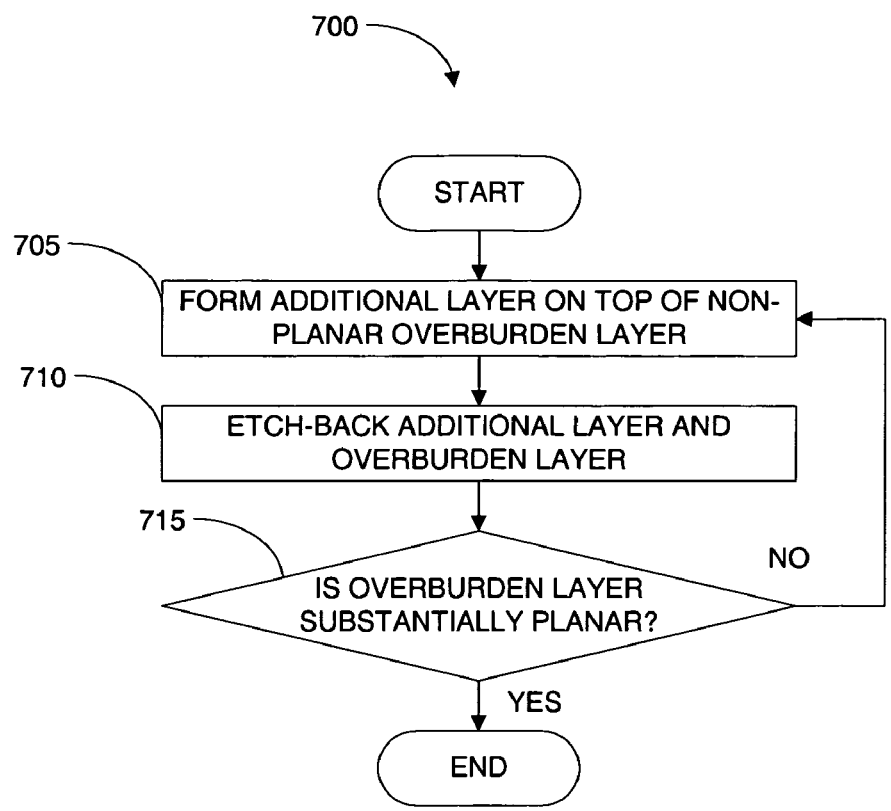
FIG. 7 is a flowchart of the method operations of the chemical conversion and etch-back processes applied to a substrate to increase local uniformity, in accordance with one embodiment of the present invention.

Referring now to FIGS. 6B and 7, in operation 705, an additional layer 604 is formed on top of the overburden portion 602. The additional layer 604 may be deposited or formed on the overburden portion 602. By way of example, the additional layer 604 can be formed through a chemical conversion of a top-most portion of the overburden portion 602. If the overburden portion 602 is copper or copper alloy, then a controlled exposure to a gas can form a copper reaction product layer 604. One example is a halogen gas that can form a Cu-halide layer 604. The copper reactant layer 604 diffuses into the surface of the copper overburden 602 to convert a top portion of the copper overburden 602. Processes for chemical conversion of copper are known in the art, such as Nagraj S. Kulkarni and Robert T. DeHoff, "Application of Volatility Diagrams for Low Temperature, Dry Etching, and Planarization of Copper", Journal of Electrochemical Society, 149 (11) G620–G632, 2002.

In another example, the additional layer 604 can be deposited on the overburden portion 602. The deposited layer 604 can include a polymer layer or an oxide layer being deposited on the overburden portion 602.

Figure 6C:
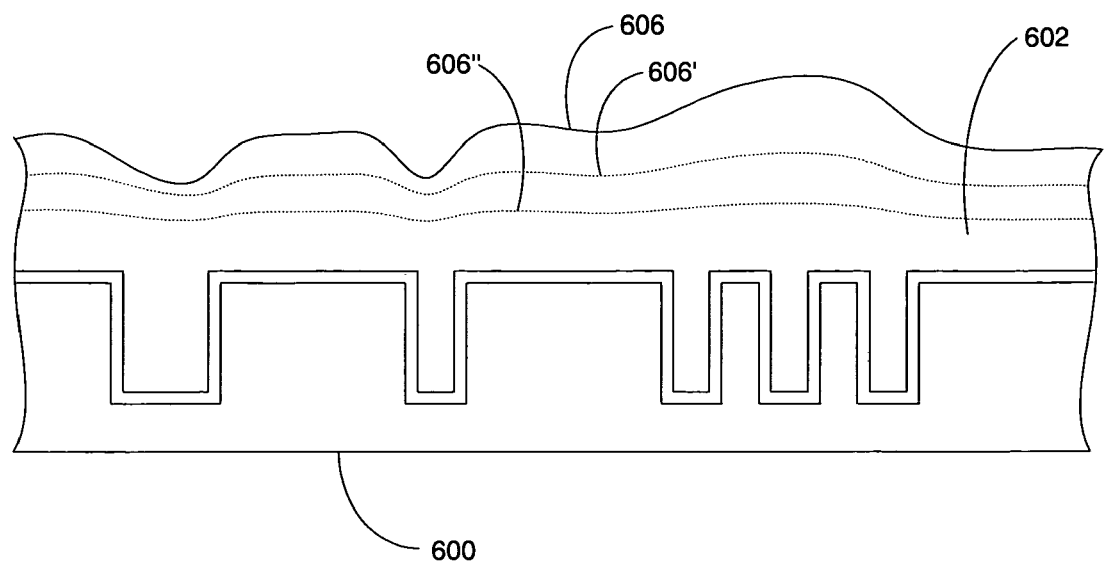
Figure 6D:
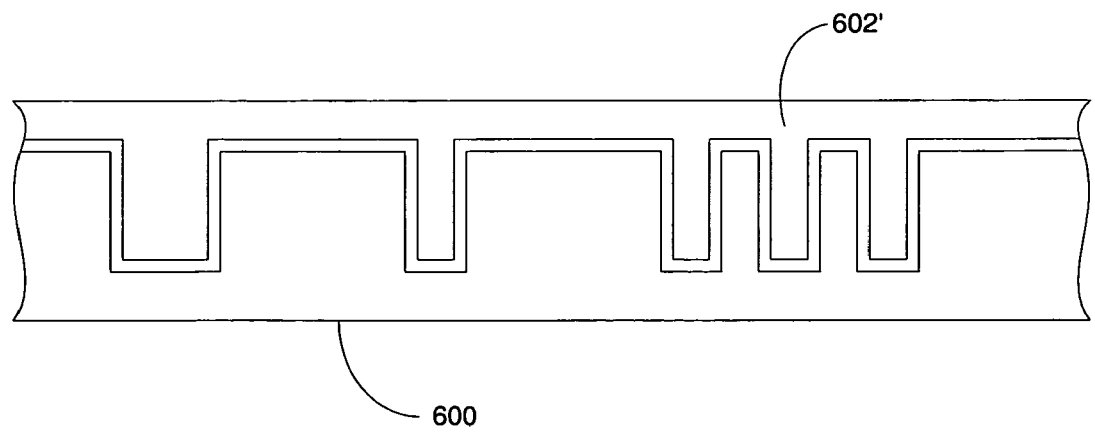

Referring now to operation 710 and FIG. 6C, an etch-back process is applied to remove the additional layer 604. A portion of the overburden portion 602 may also be removed. Removing the additional layer 604 results in further softening (i.e., planarizing) of the profile of the overburden portion 602 to profile 606'. The Cu-halide substantially softens the contours of the overburden portion 602. A Cu-halide can also maintain a substantially 1:1 etch-back selectivity with the copper overburden portion 602. Operations 705 and 710 can be repeated multiple times to substantially planarize the overburden portion 602 to subsequent profiles 606' and 606", as shown in FIG. 6D, until the resulting profile is substantially planar.

Chemical conversion of copper overburden portion 602 utilizing shape dependence of compound formation can be typically achieved by oxidizing the copper at the Cu-reactive species interface. Copper oxidization in this instance can include a chemical conversion of elemental copper to a copper compound with copper in a positive oxidation state. By way of example, oxidation of the copper to cuprous- or cupric chloride ($CuCl$ or $CuCl2$) at the surface can occur in a chlorine plasma at lower temperatures (e.g., <200 degrees C.).

The etch-back process involves reduction of this copper compound to another chemical compound capable of being volatile and thus leaving the surface of the remaining overburden 602' at the fixed substrate temperature. By way of example, there can be a reduction of the $CuCl2$ to volatile $Cu3Cl3$ in the presence of reactive hydrogen species (e.g., $H2$ plasma). Alternating the shape-dependent conversion followed by etch-back of the converted portion can lead to bulk removal of the copper overburden portion 602, while simultaneously planarizing the topography (e.g., profile) of the copper overburden portion 602.

In operation 715, if the overburden portion 602 is substantially planarized, then the method operations end. Alternatively, if in operation 715, the overburden portion 602 is not substantially planarized, then the method operations continue at operation 705 above. In one embodiment, operations 705–715 can occur in situ within a single etch chamber. In an alternative embodiment, operation 710 can occur ex situ and can include ECD or low-down force CMP processes to achieve the substantially planar overburden portion 602' as shown in FIG. 6D.

The method operations described in FIGS. 6A–7 can be used as a planar bulk removal process that performs both planarization of the non-planar overburden portion 602 and removal of the bulk of the overburden portion 602.

The local thickness of the substrates 100, 600 can be determined through any one or more of several known layer thickness mapping technologies that are known in the art. By way of example, an eddy current sensor can map the thickness of the overburden portion 112, 112' as described in commonly owned U.S. patent application Ser. No. 10/328,912 entitled System, Method And Apparatus For Thin-Film Substrate Signal Separation Using Eddy Current by Gotkis et al., filed on Dec. 23, 2002 and U.S. patent application Ser. No. 10/251,033 entitled System And Method For Metal Residue Detection And Mapping Within A Multi-Step Sequence by Gotkis et al., filed on Sep. 19, 2002, which are incorporated by reference herein, in their entirety.

The methods and systems described in FIGS. 1–7 above describe various approaches to substantially eliminating local, pattern dependant non-uniformities in an overburden portion. However, methods and systems described in FIGS. 1–7 above do not directly address correction of global non-uniformities. Global non-uniformities can include variations in removal rates of material in the center of the substrate as compared to the edge of the substrate and other non-uniformities that are not localized phenomena.

Figure 8:
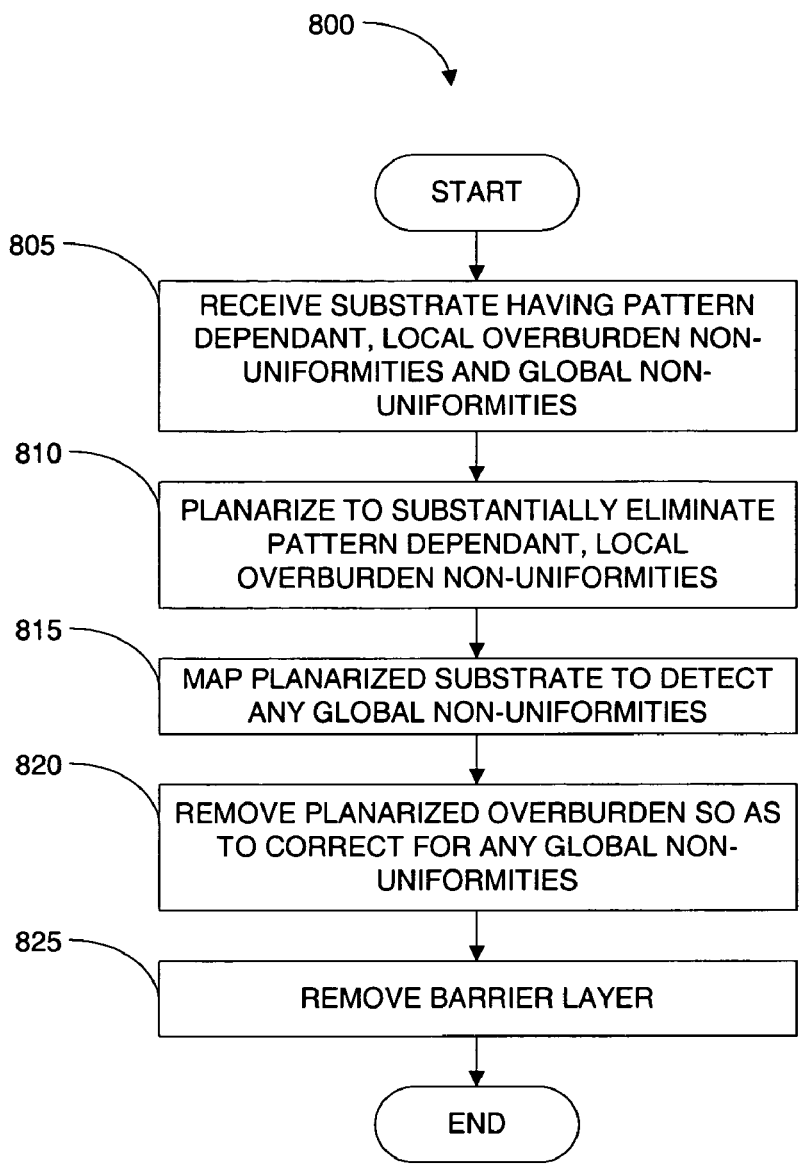
FIG. 8 is a flowchart of the method operation of correcting global non-uniformities in accordance with one embodiment of the present invention.

FIG. 8 is a flowchart of the method operation 800 of correcting global non-uniformities in accordance with one embodiment of the present invention. In operation 805, a substrate having localized non-uniformities such as feature-pattern dependant non-uniformities in the overburden portion is received. In operation 810, the localized non-uniformities are substantially eliminated such as through CMP, ECP or the methods and systems described in FIGS. 1–7 above or any other method known in the art. Substantially removing the localized non-uniformities forms a substantially, locally planarized overburden portion such as the planarized overburden portion 112' shown in FIG. 3 above.

Figure 9:
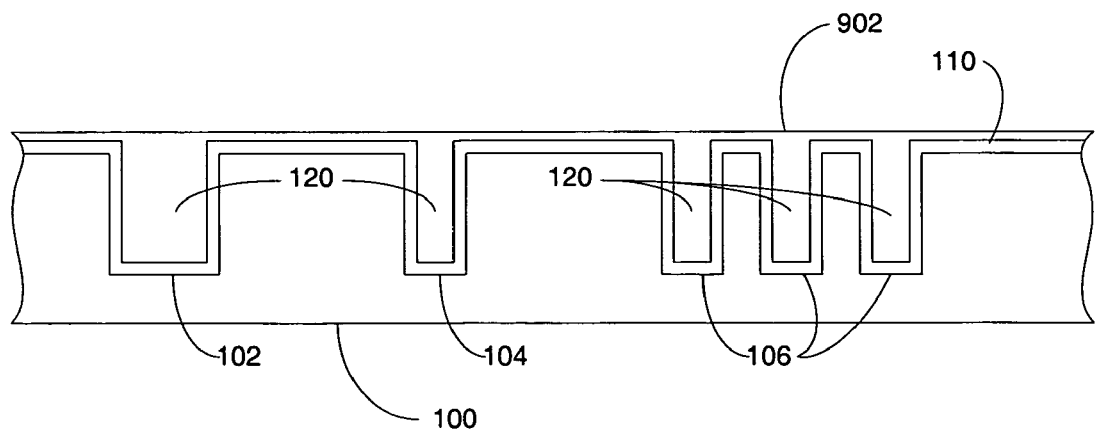
FIG. 9 shows a substantially removed, planarized overburden portion in accordance with one embodiment of the present invention.

FIG. 9 shows a substantially removed, planarized overburden portion 902 in accordance with one embodiment of the present invention. The substantially removed, planarized overburden portion 902 can be a relatively thin overburden portion such as a few hundred angstroms in thickness.

In operation 815, the substrate with the planarized overburden portion is mapped to identify and quantify any global non-uniformities in the planarized overburden portion. The planarized overburden portion can be mapped with any one or more of several known layer thickness mapping technologies that are known in the art as described above. The mapping can be in situ (within the current process chamber) or ex situ (external to the current process chamber). An in situ mapping process can also be dynamic and allow for the subsequent processes to be dynamically adjusted as the subsequent processes progress.

In operation 820, the location and quantity of the global non-uniformities, as determined in operation 815 above, are removed in a substantially mechanical stress-free process by adjusting and controlling an etching process to address the specific requirements of the detected global non-uniformities in a finish etch process. By way of example, if the remaining overburden portion 902 were approximately 500 angstroms thick in the center and 300 angstroms thick on the edge, then the recipe can be adjusted such that the center to edge non-uniformity can be compensated for so that the entire barrier layer 110 will be exposed simultaneously. The stress-free process avoids the CMP problems described above because no mechanical force is applied to the substrate during the etch-back process.

The recipe (e.g., selected values of process variables) that is selected is selective to barrier layer 110 (i.e., will etch the barrier at a much slower rate than the recipe will etch the copper, e.g., a typical selectivity range of copper etch over barrier etch in these processes is greater than about 1 but less than about 3) and that will minimize any recesses (e.g., excess removal of the conductive material 120 in the features 102, 104, 106).

The finish etch can have relatively slow etch rates for both copper of the remaining overburden portion 902 and the barrier layer 110 to minimize any recess into the features 102, 104, 106 with respect to the remaining height barrier of the barrier layer 110. As a result, the finish etch cannot have a very high selectivity to etch the copper.

A final etch-back process can also be included. The final etch-back process includes etch-back of the mask material and/or the ILD material with appropriate selectivity and uniformity control such that the final outcome provides substantially globally uniform and substantially planar features with minimal copper and ILD loss (e.g., any copper recess is globally uniform across the substrate 100 at the end of the final etch and barrier removal processes). In this instance, the final etch would include a uniform process to etch-back the mask material with high selectivity to minimize copper loss and minimize the copper recess. By way of example, a halogen-based process where the halogen concentration is low and the substrate temperature is low (e.g., less than about 200 degrees C.) will maintain a low copper etch rate while still sufficiently chemically etching the mask material. Any plasma feed gas including halogen reactive species (e.g., CF4, C2F6, C4F6) can be used. Etch rate control additives can include Ar, O2, CH2F2 and others can also be included.

If the global copper recess and/or mask/ILD loss are non-uniform across the substrate at the end of the finish etch and final etch-back process, then additional variations in the recipe must be taken to correct for the global non-uniformities. By way of example, typical instances are a result of etch non-uniformity are described as center fast or edge fast etch rates. In either of these instances, can result in a variation in copper recess and/or mask/ILD loss across the substrate. Compensation can be achieved to counter this variation to obtain globally planar features with minimal copper and mask loss utilizing appropriate uniformity and selectivity controls during the final etch-back of the mask/ILD material. In the instance of a center-fast finish etch process resulting in larger copper recess in the center of the substrate can be compensated for by an edge-fast final etch back process which selectively etches the mask material to bring to the same level as the copper level in the features 102, 104, 106. Typical selectivity obtained in this process is greater than about 2. Variations of the recipe to provide for uniformity control include pressure, temperature variation across substrate, ion flux uniformity controls, gas concentrations and chamber wall temperature. Variations to control selectivity include reactive halogen species concentration, substrate temperature, and bias power.

Alternatively, non-uniformity in the remaining overburden could be corrected and controlled by a selective wet-etch process.

A dynamic liquid meniscus can be supported and moved (e.g., onto, off of and across a wafer) with a proximity head. Various proximity heads and methods of using the proximity heads are described in co-owned, co-pending U.S. patent application Ser. No. 10/330,843 filed on Dec. 24, 2002 and entitled "Meniscus, Vacuum, IPA Vapor, Drying Manifold," which is a continuation-in-part of co-pending U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,692, filed on Mar. 31, 2003, entitled "Methods and Systems for Processing a Substrate Using a Dynamic Liquid Meniscus," U.S. patent application Ser. No. 10/603,427, filed on Jun. 24, 2003, and entitled "Methods and Systems for Processing a Bevel Edge of a Substrate Using a Dynamic Liquid Meniscus," and U.S. patent application Ser. No. 10/606,022, filed on Jun. 24, 2003, and entitled "System and Method for Integrating In-Situ Metrology within a Wafer Process." The aforementioned applications being incorporated by reference in their entirety.

Figure 10A:
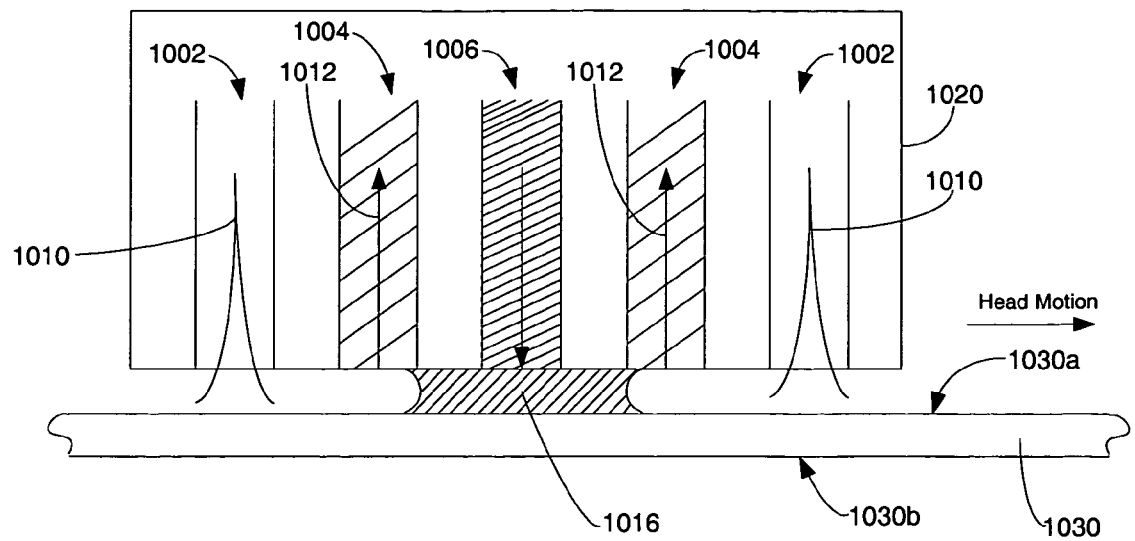
FIG. 10A illustrates a proximity head performing an exemplary wafer processing operation in accordance with one embodiment of the present invention.

FIG. 10A illustrates a proximity head 1020 performing an exemplary wafer processing operation in accordance with one embodiment of the present invention. The proximity head 1020, in one embodiment, moves while in close proximity to the top surface 1030a of the wafer 1030 to conduct a cleaning, drying, etching or other processing operation. It should be appreciated that the proximity head 1030 may also be utilized to process (e.g., clean, dry, etch, etc.) the bottom surface 1030b of the wafer 1030. In one embodiment, the wafer 1030 is rotating so the proximity head 1020 may be moved in a linear fashion along the head motion while fluid is removed from the top surface 1030a. By applying the IPA 1010 through the source inlet 1002, the vacuum 1012 through source outlet 1004, and the deionized water 1014 through the source inlet 1006, the meniscus 1016 can be generated.

Figure 10B:
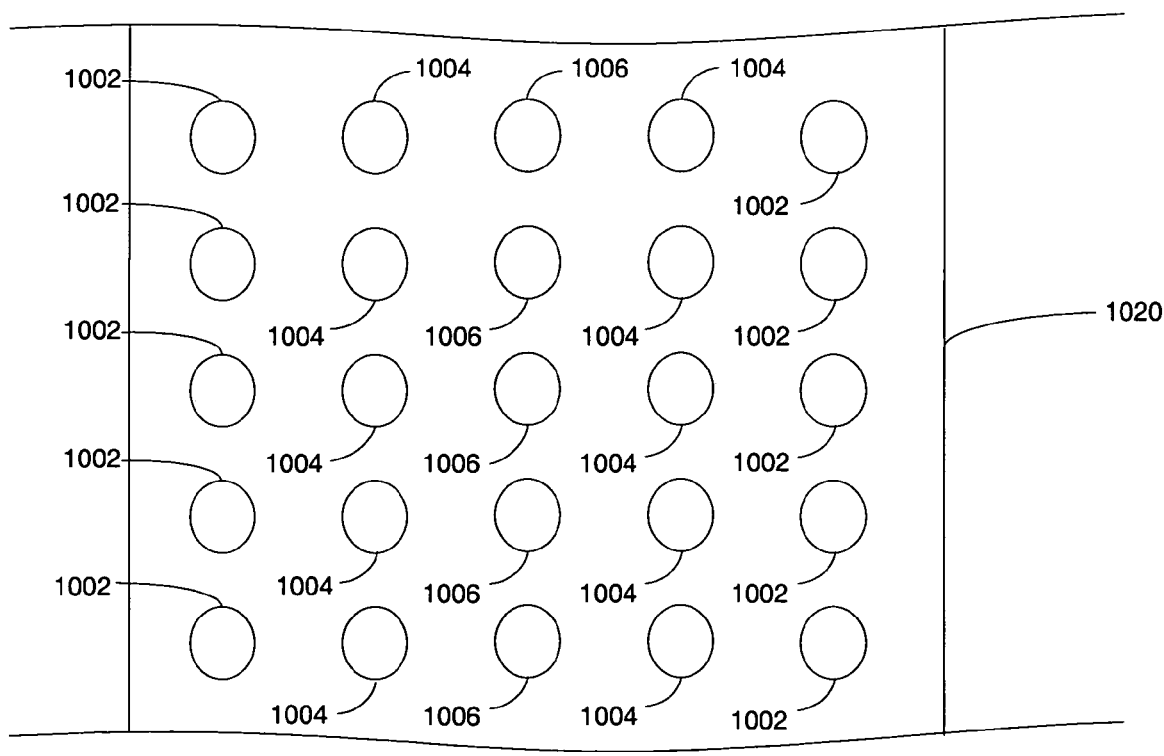
FIG. 10B shows a top view of a portion of a proximity head in accordance with one embodiment of the present invention.

FIG. 10B shows a top view of a portion of a proximity head 1020 in accordance with one embodiment of the present invention. In the top view of one embodiment, from left to right are a set of the source inlet 1002, a set of the source outlet 1004, a set of the source inlet 1006, a set of the source outlet 1004, and a set of the source inlet 1002. Therefore, as $N_2$/IPA and DIW are inputted into the region between the proximity head 1020 and the wafer 1030, the vacuum removes the $N_2$/IPA and the DIW along with any fluid film that may reside on the wafer 1030. The source inlets 1002, the source inlets 1006, and the source outlets 1004 described herein may also be any suitable type of geometry such as for example, circular opening, square opening, etc. In one embodiment, the source inlets 1002 and 1006 and the source outlets 1004 have circular openings.

Figure 11A:
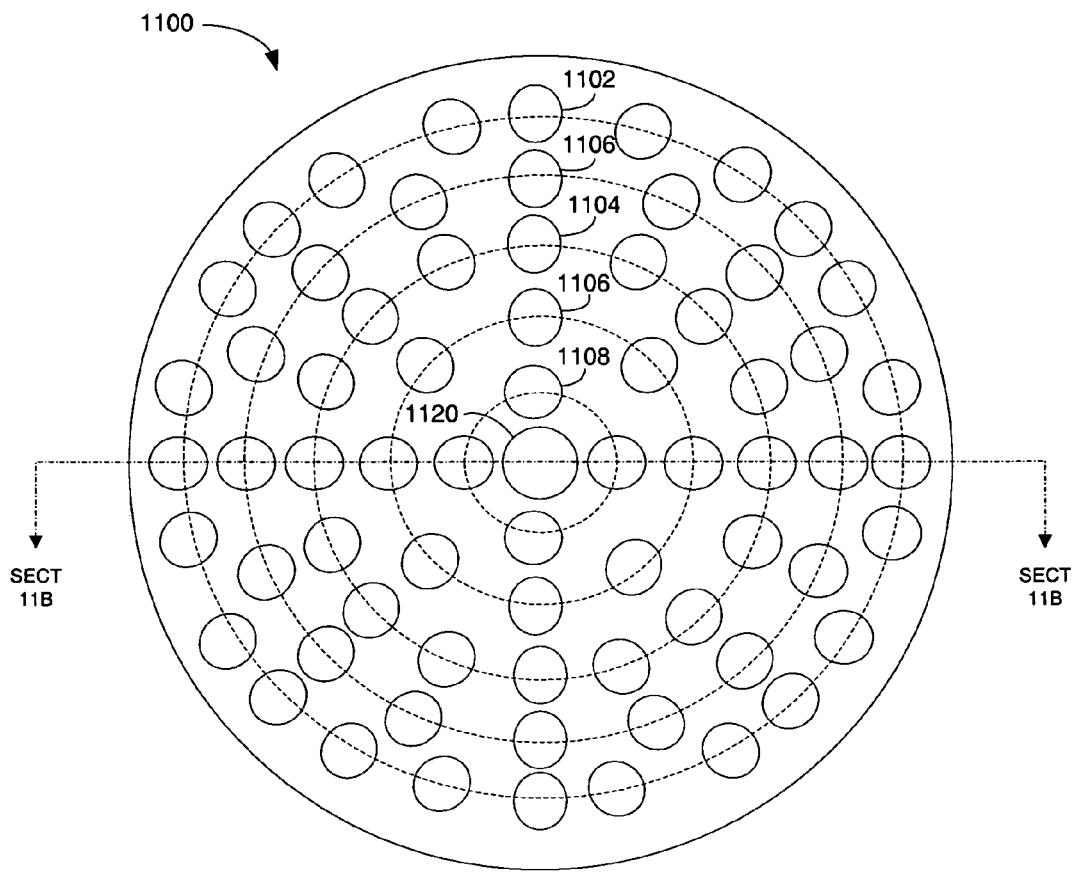
FIG. 11A illustrates an exemplary proximity head, in accordance with one embodiment of the present invention.
Figure 11B:
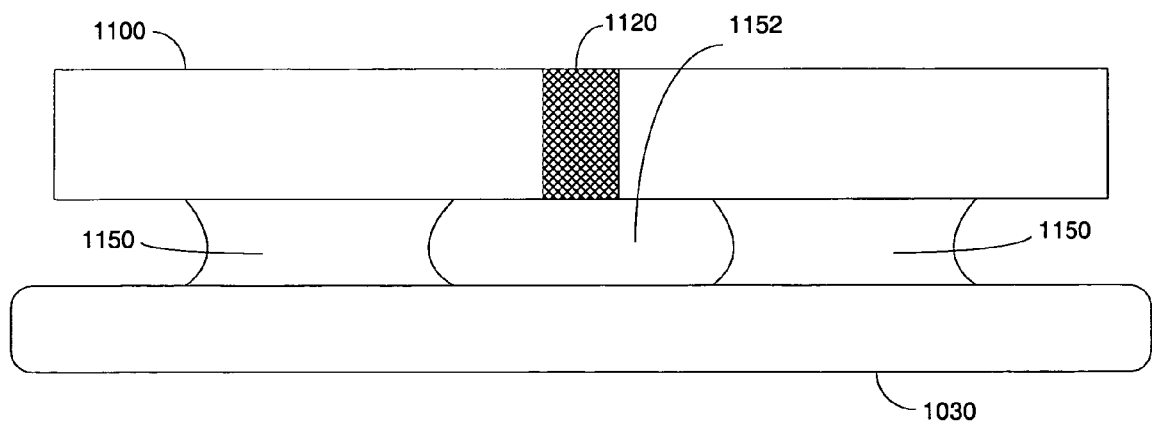
FIG. 11B illustrates a sectional view of the proximity head and the meniscus formed by the proximity head, in accordance with one embodiment of the present invention.

FIG. 11A illustrates an exemplary proximity head 1100, in accordance with one embodiment of the present invention. FIG. 11B illustrates a sectional view of the proximity head 1100 and the meniscus 1150 formed by the proximity head 1100, in accordance with one embodiment of the present invention. The proximity head 1100 includes a ring of multiple process chemistry inlets 1104, two rings of multiple IPA inlets 1102 and 1108 and a ring of multiple vacuum outlets 1106. The various inlets 1102, 1104, 1106 and outlets 1108 are arranged around a sensor 1120. The sensor 1120 is a metrology sensor that can evaluate the progress of the fabrication process being applied by the processing head 1100. The sensor can be an optical end-point detection sensor so as to enable the above-described endpoint detection systems and methods to be used.

The meniscus 1150 can include a "dry" central region 1152 where the liquid meniscus is removed so that the sensor 1120 has no intervening processing chemistry from the meniscus 1150 between the sensor and the surface of the wafer 1030. Rotating the wafer 1030 and scanning the proximity head 1100, and therefore the sensor 1120, across the wafer 1030 can provide an in-situ scan of the entire surface of the wafer, as the proximity head processes the wafer. The sensor 1120 can also provide real time feedback of the etch process. Providing the real time feedback to a control system that controls the etch process will provide a closed control loop of the etch process. The closed loop control of the etch process can allow the control system to interactively adjust the etch process in real time. Any of the multiple etch process variables can be adjusted including head position, concentrations, resident time, flow rates, pressures, chemistry and other process variables. In this manner more precise process control is provided. A more precise process control allows ever more concentrated etch chemistries to be used, which in turn reduces the process time of the wafer to a minimum.

The in-situ, real time control of the process can also enable a variable process to be applied to the surface of the wafer such as to correct for a non-uniformity during the processing of the wafer. By way of example, if in an etch process, the sensor can detect a thinner film in a first region of the wafer 1030 and a thicker film in a second region. The etch process recipe can be dynamically adjusted (e.g., etch chemistry concentration, residence time, etc.) for the detected film thickness as the proximity head 1100 scans across the wafer 1030. As a result, the non-uniform film thickness can be dynamically corrected in-situ as the etch process is applied to the wafer 1030 thereby substantially eliminating the need for reprocessing the wafer to correct for non-uniformities.

In an alternative embodiment, the dry region 1152 is not required. By way of example, if the sensor 1120 can measure film thickness through a layer of liquid (e.g., the meniscus 1150) such as the process chemistry being applied to the surface of the wafer 1030.

Figure 12:
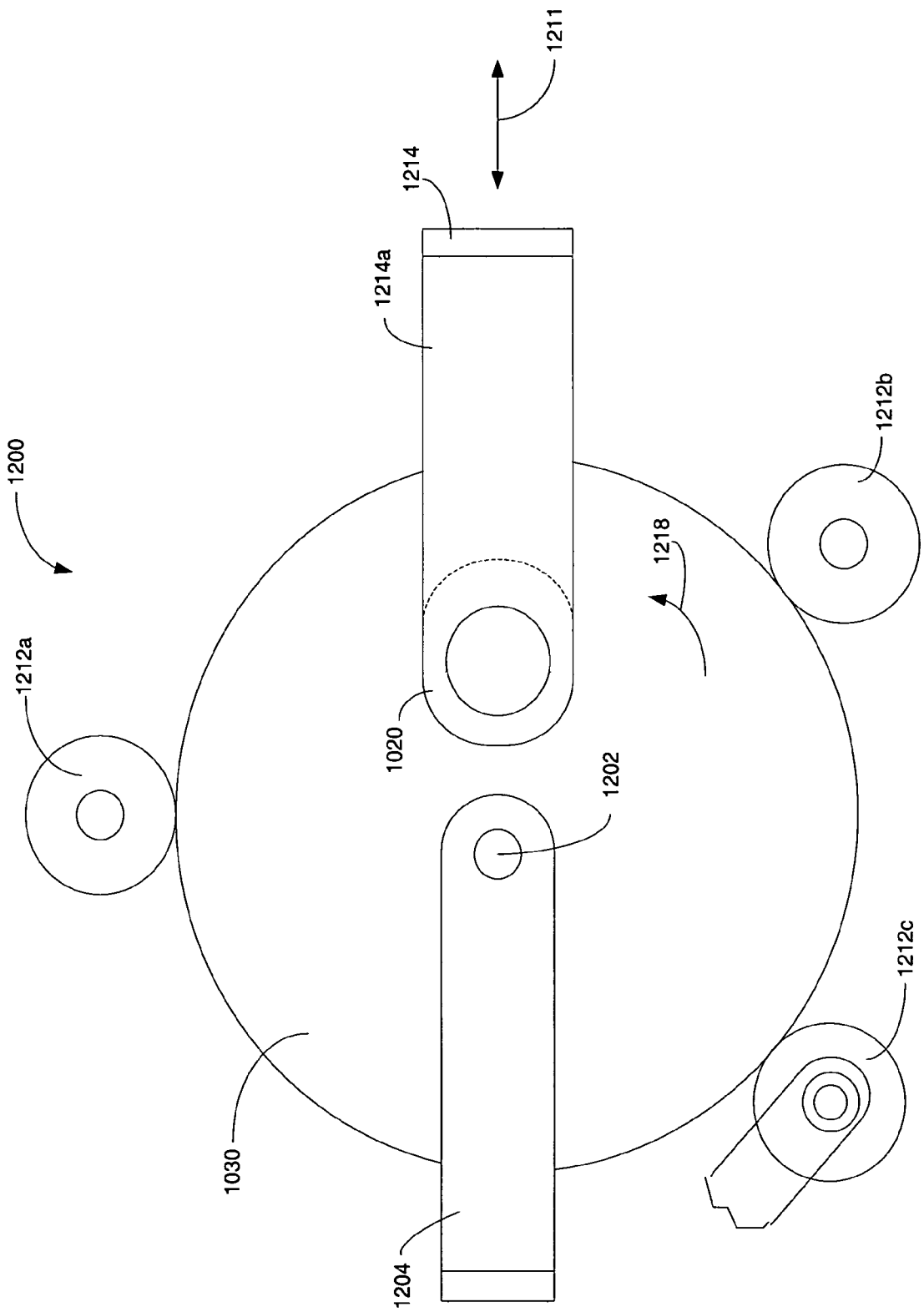
FIG. 12 shows a wafer processing system in accordance with one embodiment of the present invention.

FIG. 12 shows a wafer processing system 1200 in accordance with one embodiment of the present invention. The wafer processing system 1200 supports a wafer 1030 between multiple edge rollers 1212A–1212C. A movable arm 1214A supports and moves a proximity head 1020 over the surface of the wafer 1030. An in-situ sensor 1202 can be mounted on the arm 1214A, external of the proximity head 1020 or can be mounted on a separate movable arm 1204 that can move independent of the movable arm 1214A that supports the proximity head 1020. As a result, the sensor 1202 can scan and measure corresponding locations near the process being applied to the wafer 1030 by the proximity head 1020. Alternatively, the sensor 1202 can measure corresponding locations near the process being applied to the wafer 1130 by the proximity head 1120 and can independently scan locations on the surface of the wafer substantially simultaneously as the proximity head applies a process to the wafer.

Figure 13:
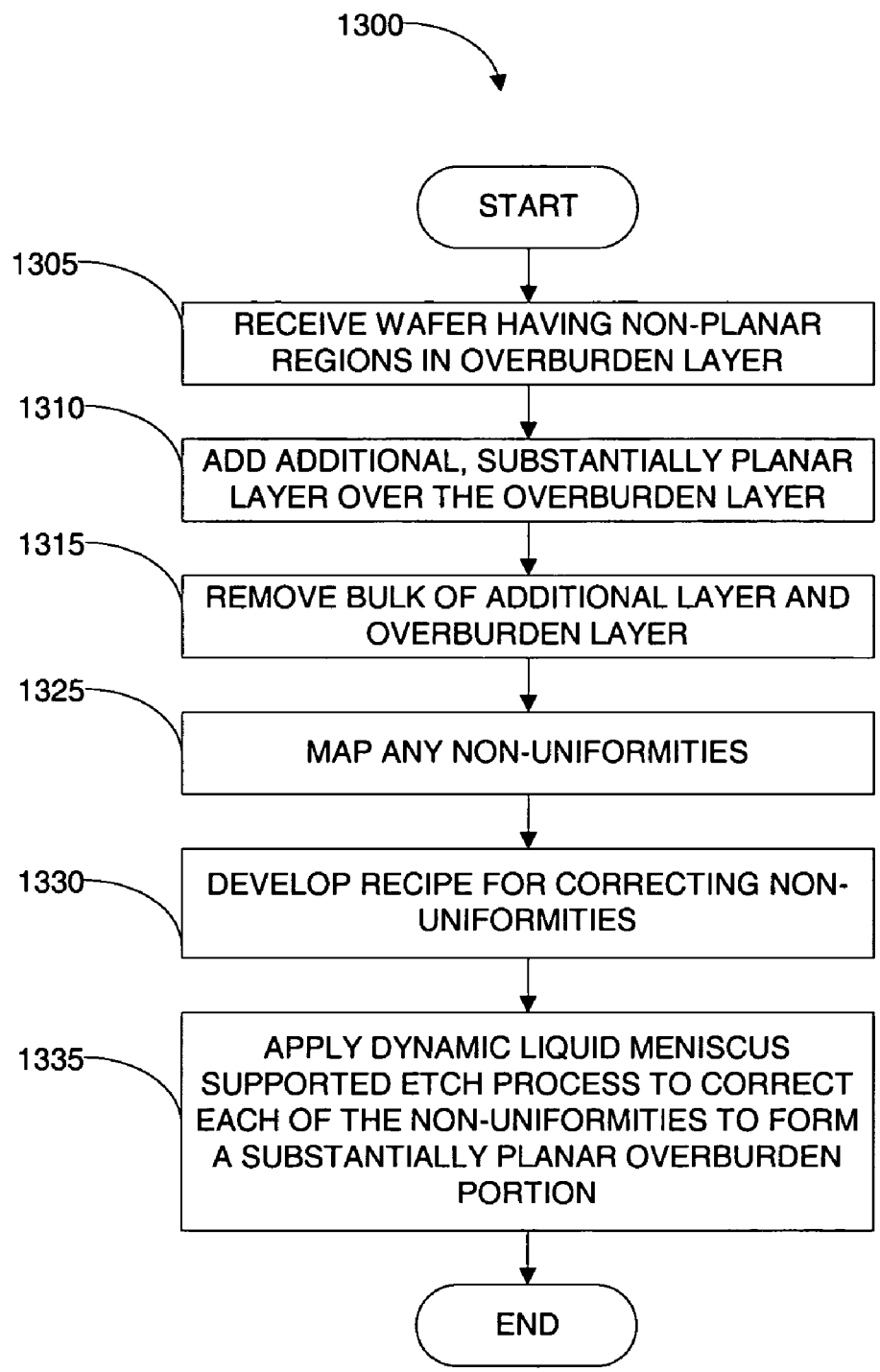
FIG. 13 is a flowchart of an alternative method operations for providing a substantial planar and uniform overburden portion, in accordance with one embodiment of the present invention.

FIG. 13 is a flowchart of an alternative method operations 1300 for providing a substantial planar overburden portion 112', in accordance with one embodiment of the present invention. In an operation 1305, a non-planar and/or non-uniform wafer, such as shown in FIG. 1 above, is received for processing. In an optional operation 1310, a substantially planar, additional layer 202 can be added as described in FIG. 2 above. In operation 1315, a CMP planarization operation is performed to remove a bulk of the over burden layer. The remaining overburden portion can include multiple local and even global non-uniform regions. As described above, both local and global non-uniformities can be caused by innumerable causes. The CMP planarization operation can be a low down-force CMP operation so as to impart the least possible shearing forces on the underlying layers formed on the substrate.

In an operation 1325, the multiple non-uniform regions on the wafer are mapped. These non-uniform regions can be mapped by any number of types of metrology sensors and methods of using the various metrology sensors. By way of example the non-uniformities can be mapped by an eddy current sensor such as described in co-owned and co-pending U.S. patent applications: application Ser. No. 10/328,912, entitled "System, Method and Apparatus for Thin-Film Substrate Signal Separation Using Eddy Current", filed on Dec. 23, 2002, and application Ser. No. 10/256,055, entitled "Enhancement of Eddy Current Based Measurement Capabilities," filed on Sep. 25, 2002, which are incorporated by reference herein in its entirety for all purposes. The non-uniformities can be mapped either in-situ or ex-situ. The non-uniformities can also be mapped and displayed such as described in co-owned and co-pending U.S. patent application Ser. No. 10/331,194, entitled "User Interface for Quantifying Wafer Non-Uniformities and Graphically Explore Significance," which was filed on Dec. 24, 2002 and is incorporated by reference herein for all purposes.

In an operation 1330, a recipe for correcting the mapped non-uniformities can be automatically developed. Developing the recipe can include quantifying each of the mapped non-uniformities. By way of example a thickness and a location of each of the non-uniformities can be accurately calculated. Once the non-uniformities are quantified, then appropriate process chemistry (e.g., a mixture of sulfuric acid and hydrogen peroxide) concentration, time and other process variables for processing by a dynamic liquid meniscus can be determined.

In an operation 1335, a dynamic liquid meniscus processes the wafer, such as described in FIGS. 10A–12 above. The dynamic liquid meniscus can etch each of the mapped non-uniformities to form the substantially uniform overburden portion 112', as shown in FIG. 3 above. The wafer can be further etched to remove the remaining, substantially uniform overburden portion 112' as described in FIG. 8 above.

Figure 14:
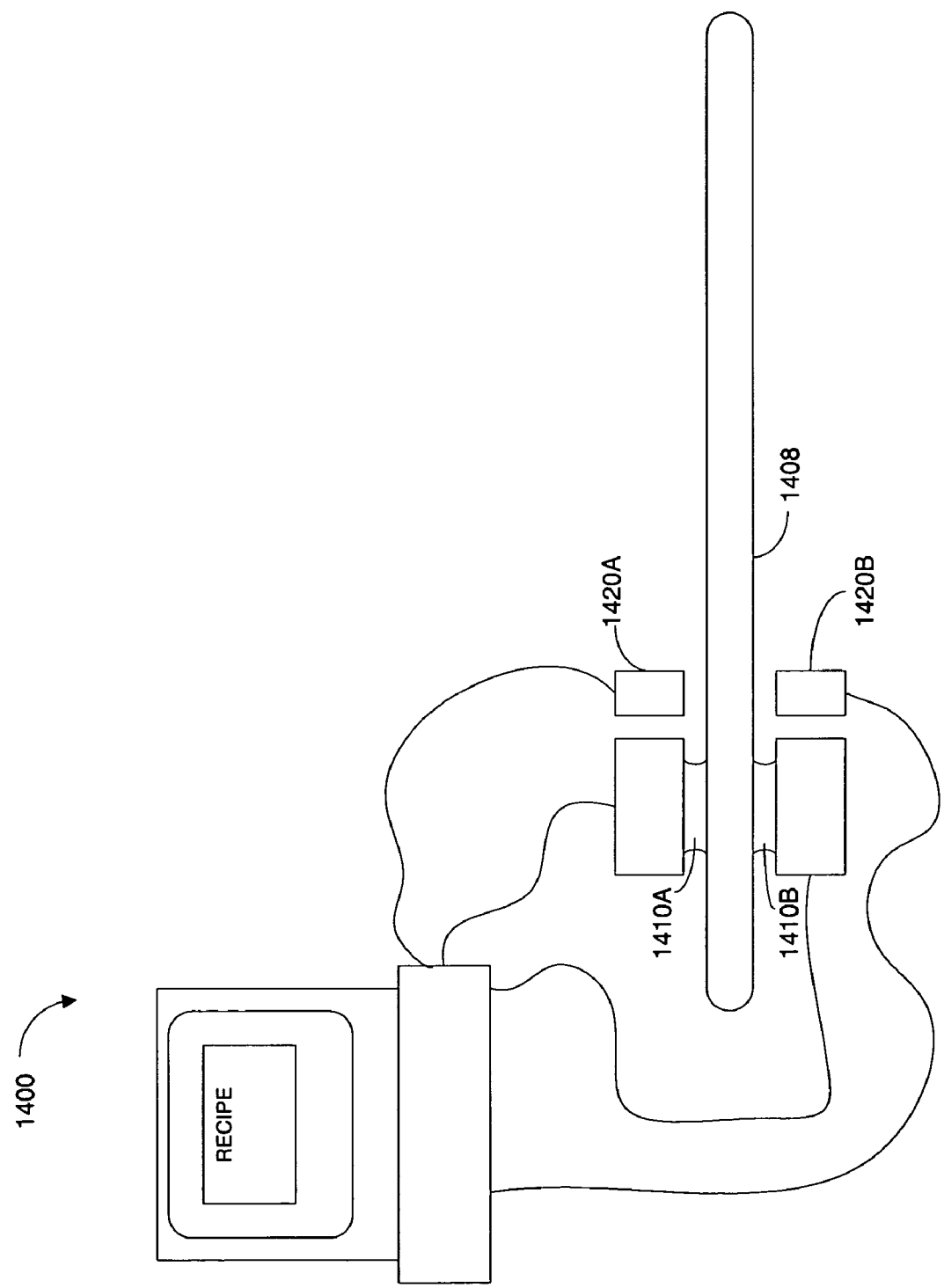
FIG. 14 shows a block diagram of a wafer processing system in accordance with one embodiment of the present invention.

A feedback monitoring signal can also be used to dynamically monitor and control the dynamic liquid meniscus, if a sensor such as sensor 1120 or 1202 is included in the dynamic liquid meniscus support apparatus. FIG. 14 shows a block diagram of a wafer processing system 1400 in accordance with one embodiment of the present invention. The system includes a controller 1402 that includes a recipe 1404. The recipe 1404 controls the various parameters and aspects of the processes applied to the wafer 1408 by a pair of dynamic liquid meniscuses 1410A, 1410B. By way of example, the recipe determines flowrates of DIW, IPA and IPA vapor and pressures of the vacuum and the precise location of the dynamic liquid meniscuses 1410A, 1410B and the direction and rate of rotation of the wafer 1408, if the wafer is rotated. Sensors 1420A, 1420B monitor and evaluate the processes applied to the wafer 1408 by the dynamic liquid meniscuses 1410A, 1410B. In one embodiment, the sensors 1420A, 1420B can provide feedback to the controller 1402. The controller 1402 can then dynamically modify the recipe in response to the feedback from one or more of the sensors. The sensors 1420A, 1420B can be included within the proximity heads that support the dynamic liquid meniscuses 1410A, 1410B such as described in FIGS. 11A and 11B above. Alternatively, the sensors 1420A, 1420B can be external to the proximity heads that support the dynamic liquid meniscuses 1410A, 1410B as described in FIG. 12 above. The sensors 1420A, 1420B can also be used to map the non-uniformities as described in operation 1325 above.

Figure 15:
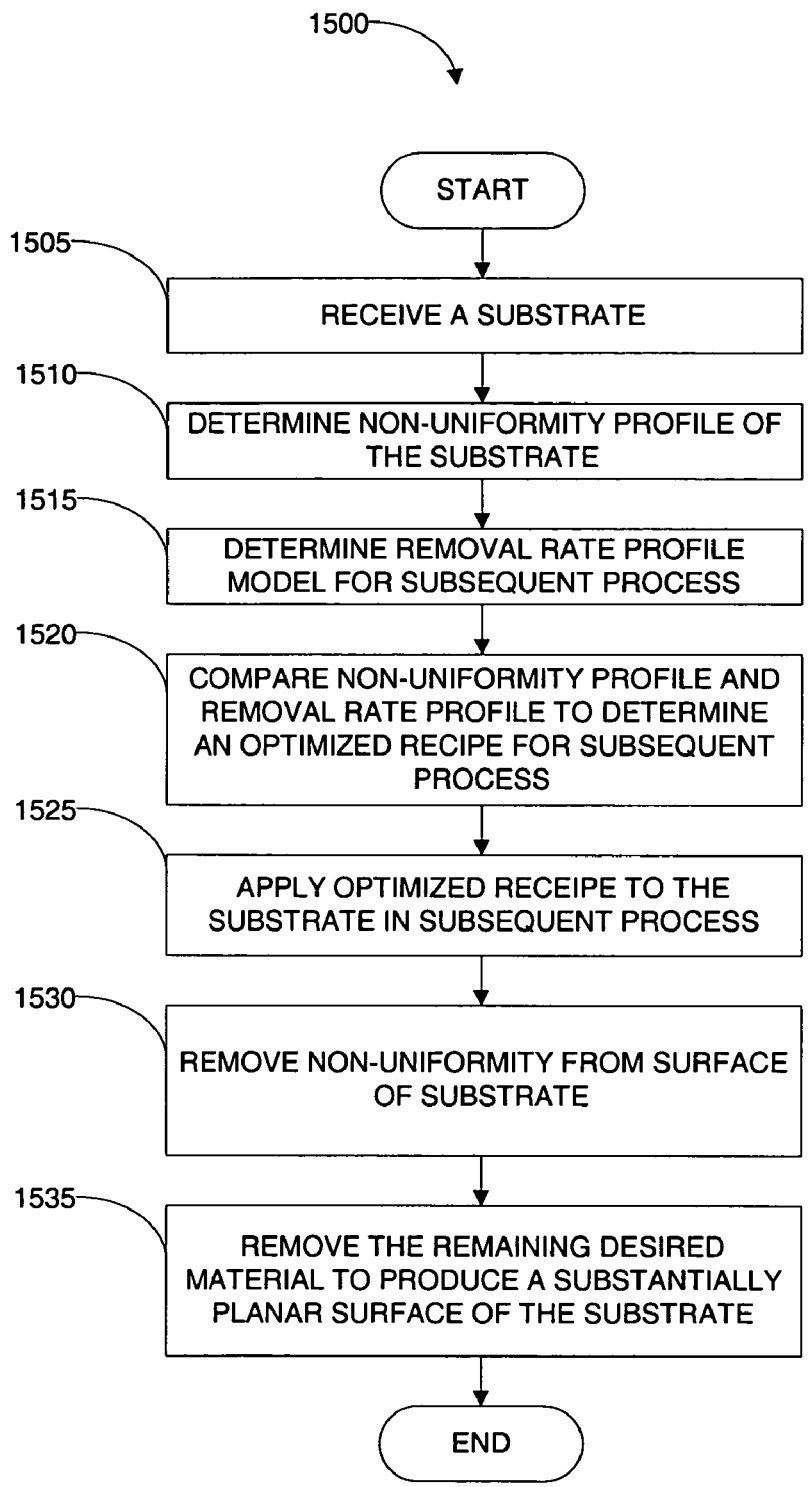
FIG. 15 is a flowchart of the method operations 1500 of a feed-forward optimization process, in accordance with one embodiment of the present invention.

In one embodiment, a system and method to improve planarization and non-uniformity an optimization scheme can be employed that correlates a spatial thickness variation in an incoming substrate with the previously determined removal rate profile of a subsequent manufacturing process (e.g., a dynamic liquid meniscus etch process). A control signal can be sent to the dynamic liquid meniscus etch process that can then perform a specific etch process to correct the thickness variation. FIG. 15 is a flowchart of the method operations 1500 of a feed-forward optimization process, in accordance with one embodiment of the present invention. In an operation 1505, a substrate is received. In an operation 1510, nonuniformity profile of the substrate is determined. The nonuniformity profile of the substrate can be determined by mapping a thickness of the substrate to identify any thickness variations. Any suitable mapping process, whether in-situ or ex-situ can be used to determine the nonuniformity profile of the substrate. The thickness variations can be caused by non-uniformities in a previous process (e.g., a CMP process) that left an uneven layer on the surface of the substrate. The non-uniformity profile includes both a location (i.e., a Cartesian x and y coordinate or a radius and angle or other type of location identifier) and the thickness of the non-uniformity.

A non-uniformity profile model of the previous process can also be determined. The non-uniformity profile model of the previous process can be a statistical analysis (e.g., an average) of the non-uniformity profiles of multiple substrates output from the previous process. The non-uniformity profile model can be used to predict the performance of the previous process.

In an operation 1515, a removal rate profile model of the subsequent process can be determined. A removal rate profile model can be determined through a statistical analysis of multiple processes of substrates through the subsequent process. A measurement that both precedes and follows the subsequent process can provide, for example, an average removal rate for each of several locations on the surface of the substrate. By way of example, a dynamic liquid meniscus etch process can be applied to multiple substrates. Each of the multiple substrates can be mapped before and after the dynamic liquid meniscus etch process and a removal rate profile model can thereby be determined. The removal rate profile model can include an average removal rate for each of several locations of the surface of the substrate.

The removal rate profile model can also include a range of one or more parameters and the corresponding effects on the removal rate profile model. By way of example, a specific etchant chemistry concentration can result in a less or greater etch rate. The concentration and process time can thereby be correlated.

In an operation 1520, the non-uniformity profile of the received substrate is compared to the removal rate profile model of the subsequent process. Various parameters (e.g., time, process chemistry, pressure, etc.) of the subsequent process are then selected to produce an optimized recipe to correct the non-uniformity profile of the received substrate. Alternatively, the non-uniformity profile model of the preceding process can be compared to the removal rate profile of the subsequent process to produce the optimized recipe. In an operation 1525, the substrate and the optimized recipe for the subsequent process are input to the subsequent process.

In an operation 1530, the subsequent process removes the non-uniformity from the substrate such that the surface of the substrate. By way of example, in a dynamic liquid meniscus etch process and a substrate that has a non-uniform copper layer, the non-uniformity can be removed by the dynamic liquid meniscus etch process to leave a uniform copper layer. In an operation 1535, the remaining copper layer can be removed leaving a substantially planar and uniform surface on the substrate.

It will be further appreciated that the instructions represented by the operations in any of the above figures are not required to be performed in the order illustrated, and that all the processing represented by the operations may not be necessary to practice the invention. Further, the processes described in any of the above figures can also be implemented in software stored in any one of or combinations of the RAM, the ROM, or a hard disk drive of a computer or microprocessor control system (e.g., a process control system).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for planarizing a patterned semiconductor substrate comprising:
   receiving a patterned semiconductor substrate, having a conductive interconnect material filling a plurality of features in the pattern, the conductive interconnect material having an overburden portion;
   removing a bulk of the overburden portion without imparting mechanical stress to the plurality of features, a remaining portion of the overburden portion having a non-uniformity;
   mapping the non-uniformity;
   forming a dynamic liquid meniscus etch process recipe including:
      quantifying the non-uniformity; and
      calculating an etch process chemistry concentration and application time corresponding to the quantified non-uniformity; and
   applying a dynamic liquid meniscus etch process using the dynamic liquid meniscus etch process recipe to correct the non-uniformity of the remaining portion of the overburden portion.

2. The method of claim 1, wherein removing the bulk of the overburden portion includes removing the bulk of the overburden portion in a CMP operation.

3. The method of claim 1, wherein removing the bulk of the overburden portion includes removing the bulk of the overburden portion in a low down force CMP operation.

4. The method of claim 1, further comprising, forming an additional layer on the overburden portion, the additional layer being substantially planar.

5. The method of claim 4, wherein removing the bulk of the overburden portion includes substantially entirely removing the additional layer.

6. The method of claim 4, wherein additional layer and the overburden portion have a substantially 1:1 etch selectivity.

7. The method of claim 1, wherein applying the dynamic liquid meniscus etch process using the dynamic liquid meniscus etch process recipe includes:
   monitoring the dynamic liquid meniscus etch process; and
   providing feedback to a dynamic liquid meniscus etch process controller.

8. The method of claim 7, wherein the dynamic liquid meniscus etch process controller automatically modifies at least one aspect of the dynamic liquid meniscus etch process recipe according to the feedback.

9. The method of claim 7, wherein the dynamic liquid meniscus etch process controller moves the dynamic liquid meniscus relative to a surface of the substrate.

10. The method of claim 7, wherein monitoring the dynamic liquid meniscus etch process includes scanning a surface of the substrate with a metrology sensor.

11. The method of claim 10, wherein the metrology sensor is included within the dynamic liquid meniscus.

12. The method of claim 10, wherein the metrology sensor maps the non-uniformity.

13. The method of claim 1, wherein mapping the non-uniformity includes identifying a non-uniformity profile for the substrate including one or more variations in thickness of the non-uniformity and a corresponding location for each of the one or more variations in thickness of the non-uniformity.

14. The method of claim 13, further comprising optimizing a bulk removal process used to remove the bulk of the overburden portion to substantially eliminate a production of a non-uniformity described by the non-uniformity profile during the bulk removal process for a subsequently received patterned semiconductor substrate.

15. The method of claim 14, wherein forming a dynamic liquid meniscus etch process recipe further includes:
    calculating a removal rate profile model for a subsequent process;
    comparing the non-uniformity profile for the substrate to the removal rate profile model for the subsequent process; and
    optimizing one or more parameters of the subsequent process.

16. The method of claim 15, wherein the subsequent process can include at least one of a group of processes consisting of the dynamic liquid meniscus etch process, a dry etch process, and a wet etch process.

17. The method of claim 1, wherein the conductive interconnect material includes copper.

18. The method of claim 1, wherein the conductive interconnect material includes elemental copper.

19. The method of claim 1, wherein the pattern is formed on the patterned semiconductor substrate in a dual damascene process.

20. A semiconductor device formed by a method comprising:
    receiving a patterned semiconductor substrate, having a conductive interconnect material filling a plurality of features in the pattern, the conductive interconnect material having an overburden portion;
    removing a bulk of the overburden portion without imparting mechanical stress to the plurality of features, a remaining portion of the overburden portion having a non-uniformity;
    mapping the non-uniformity;
    forming a dynamic liquid meniscus etch process recipe including:
        quantifying the non-uniformity; and
        calculating an etch process chemistry concentration and application time corresponding to the quantified non-uniformity; and
    applying a dynamic liquid meniscus etch process using the dynamic liquid meniscus etch process recipe to correct the non-uniformity of the remaining portion of the overburden portion.

21. A method of forming a dual damascene interconnect structure comprising:
    receiving a dual damascene patterned semiconductor substrate, having a conductive interconnect material filling a plurality of features in the dual damascene pattern, the conductive interconnect material having an overburden portion having a non-uniformity;
    forming an additional layer on the overburden portion, the additional layer being formed substantially planar; and
    etching the additional layer and at least part of the overburden portion to remove a bulk of the overburden portion, the additional layer being substantially entirely removed, a remaining portion of the overburden portion having a non-uniformity;
    mapping the non-uniformity;
    forming a dynamic liquid meniscus etch process recipe including:
        quantifying the non-uniformity; and
        calculating an etch process chemistry concentration and application time corresponding to the quantified non-uniformity; and
    applying a dynamic liquid meniscus etch process using the dynamic liquid meniscus etch process recipe to correct the non-uniformity to of the remaining portion of the overburden portion.

22. The method of claim 21, wherein applying the dynamic liquid meniscus etch process using the dynamic liquid meniscus etch process recipe includes:
    monitoring the dynamic liquid meniscus etch process; and
    providing feedback to a dynamic liquid meniscus etch process controller.

23. The method of claim 22, wherein monitoring the dynamic liquid meniscus etch process includes scanning a surface of the substrate with a metrology sensor, the metrology sensor being included within the dynamic liquid meniscus.

* * * * *